US008183745B2

(12) United States Patent
Trolier-McKinstry et al.

(10) Patent No.: US 8,183,745 B2
(45) Date of Patent: May 22, 2012

(54) HIGH FREQUENCY ULTRASOUND TRANSDUCERS

(75) Inventors: Susan Trolier-McKinstry, State College, PA (US); Thomas N. Jackson, State College, PA (US); Kyusun Choi, State College, PA (US); Richard L. Tutwiler, Port Matilda, PA (US); In Soo Kim, State College, PA (US); Hyun Soo Kim, University Park, PA (US); Sung Kyu Park, State College, PA (US); Ioanna G. Mina, State College, PA (US)

(73) Assignee: The Penn State Research Foundation, University Park, PA (US)

( * ) Notice: Subject to any disclaimer, the term of this patent is extended or adjusted under 35 U.S.C. 154(b) by 299 days.

(21) Appl. No.: 11/745,615

(22) Filed: May 8, 2007

(65) Prior Publication Data

US 2008/0018199 A1 Jan. 24, 2008

Related U.S. Application Data

(60) Provisional application No. 60/798,640, filed on May 8, 2006.

(51) Int. Cl.
*H01L 41/08* (2006.01)

(52) U.S. Cl. ......................... 310/334; 310/368; 310/369

(58) Field of Classification Search .................. 310/324, 310/331, 334, 367, 369
See application file for complete search history.

(56) References Cited

U.S. PATENT DOCUMENTS

| | | | | |
|---|---|---|---|---|
| 4,117,074 A * | 9/1978 | Tiersten et al. | 310/320 |
| 4,640,291 A | 2/1987 | 't Hoen | |
| 4,870,867 A | 10/1989 | Shaulov | |
| 5,038,068 A | 8/1991 | Kushida et al. | |
| 5,099,693 A | 3/1992 | Payne et al. | |
| 5,135,295 A | 8/1992 | Jen et al. | |
| 5,160,870 A * | 11/1992 | Carson et al. | 310/339 |
| 5,162,691 A * | 11/1992 | Mariani et al. | 310/321 |
| 5,598,050 A * | 1/1997 | Bowen et al. | 310/322 |
| 5,629,578 A | 5/1997 | Winzer et al. | |
| 5,660,877 A | 8/1997 | Venkataramani et al. | |
| 5,744,898 A * | 4/1998 | Smith et al. | 310/334 |
| 5,814,920 A * | 9/1998 | Takeuchi et al. | 310/330 |
| 5,818,149 A | 10/1998 | Safari et al. | |
| 5,841,736 A * | 11/1998 | Bowen et al. | 367/140 |

(Continued)

FOREIGN PATENT DOCUMENTS

WO WO-9948621 9/1999

(Continued)

OTHER PUBLICATIONS

Hirsch, S., S. Doerner, S. Schimpf, R. Lucklum, P. Hauptmann, and B. Schmidt. "A new device with PZT ultrasonic transducers in MEMS technology." Journal of Physics: Conference Series 2006, vol. 34, pp. 475-480.

(Continued)

*Primary Examiner* — Mark Budd

(74) *Attorney, Agent, or Firm* — Gifford, Krass, Sprinkle, Anderson & Citkowski, P.C.

(57) ABSTRACT

An example ultrasound device, such as a transducer array, includes a plurality of ultrasound transducers, each ultrasound transducer having a first electrode, a second electrode, a thin piezoelectric film located between the electrodes, and a substrate supporting the plurality of ultrasound transducers. In some examples, the electrode separation is less than 10 microns, facilitating lower voltage operation than conventional ultrasound transducers.

12 Claims, 16 Drawing Sheets

U.S. PATENT DOCUMENTS

| | | | | |
|---|---|---|---|---|
| 5,906,580 | A | 5/1999 | Kline-Schoder et al. | |
| 5,938,612 | A | 8/1999 | Kline-Schoder et al. | |
| 5,998,910 | A | 12/1999 | Park et al. | |
| 6,111,818 | A * | 8/2000 | Bowen et al. | 367/140 |
| 6,183,578 | B1 | 2/2001 | Ritter et al. | |
| 6,679,845 | B2 | 1/2004 | Ritter et al. | |
| 6,709,396 | B2 | 3/2004 | Flesch et al. | |
| 6,859,984 | B2 | 3/2005 | Dinet et al. | |
| 6,915,696 | B2 | 7/2005 | Dufait et al. | |
| 7,230,368 | B2 | 6/2007 | Lukacs et al. | |
| 7,249,513 | B1 | 7/2007 | Zipparo et al. | |
| 7,255,678 | B2 | 8/2007 | Mehi et al. | |
| 2005/0194865 | A1 * | 9/2005 | Angelsen et al. | 310/334 |
| 2005/0264133 | A1 | 12/2005 | Ketterling et al. | |
| 2006/0186761 | A1 | 8/2006 | Trolier-McKinstry et al. | |
| 2007/0172592 | A1 | 7/2007 | Trolier-McKinstry et al. | |
| 2007/0222339 | A1 | 9/2007 | Lukacs et al. | |
| 2007/0239001 | A1 | 10/2007 | Mehi et al. | |

FOREIGN PATENT DOCUMENTS

| | | |
|---|---|---|
| WO | WO-2006061647 | 6/2006 |

OTHER PUBLICATIONS

Kim, I., R.L. Tutwiler, J. Lim, T.N. Jackson, S. Trolier-McKinstry, and K. Choi. "A CMOS Transceiver Chip for High Frequency Ultrasound Imaging Applications." IEEE Ultrasonics Symposium 2006, pp. 653-656.

Yoshimura, T. and S. Trolier-McKinstry. "Growth and properties of (001) $BiScO_3$-$PbTiO_3$epitaxial films." Applied Physics Letters 2002, vol. 81, pp. 2065-2066.

Zhang, Q.Q., Q.F. Zhou, and S. Trolier-McKinstry. "Structure and piezoelectric properties of sol-gel-derived 0.5 $Pb[Yb_{1/2}Nb_{1/2}]O_3$-0.5 $PbTiO_3$thin films." Applied Physics Letters 2002, vol. 80, pp. 3370-3372.

Smith, W.A., A.A. Shaulov, and B.M. Singer. "Properties of composite piezoelectric materials for ultrasonic transducers." IEEE Ultrasonics Symposium 1984, pp. 539-544.

Bharadwaja, S.S.N., D.J. Won, H. Fang, V. Gopalan, S. Trolier-McKinstry, N. Saldanha, and T. Mayer. "Processing and Properties of High Aspect Ratio Ferroelectric Structures." IEEE International Symposium on Applications of Ferroelectrics 2004, pp. 189-192.

Mina, I.G., S.S.N. Bharadwaja, J. Raviprakash, S. Trolier-McKinestry, N. Saldanha, T. Mayer. "Molding of High Aspect Ratio Ferroelectric Microstructures." IEEE International Symposium on Applications of Ferroelectrics 2004, pp. 258-261.

Wang, L., R.A. Wolf, Y. Wang, K.K. Deng, L. Zou, R.J. Davis, and S. Trolier-McKinstry. "Design, Fabrication, and Measurement of High-Sensitivity Piezoelectric Microelectromechanical Systems Accelerometers." Journal of Microelectromechanical Systems 2003, vol. 12, pp. 433-439.

* cited by examiner

HIGH FREQUENCY ULTRASOUND TRANSDUCERS

CROSS-REFERENCE TO RELATED APPLICATIONS

This application claims priority of U.S. Provisional Patent Application Ser. No. 60/798,640 filed May 8, 2006, which is incorporated herein by reference.

FIELD OF THE INVENTION

The invention relates to ultrasound transducers, in particular high frequency, high resolution ultrasound transducers with integrated or close-coupled electronics.

BACKGROUND OF THE INVENTION

Applications of ultrasound transducers include imaging, cleaning, surgical instrumentation, nondestructive testing, sonar, and the like. In particular, ultrasound imaging of the human body is a common medical technique.

Ultrasound transducers are widely used to image subsurface features (e.g. in the human body). An ultrasound beam is reflected from any discontinuities in the acoustic impedance of the sample. The reflected ultrasound waves return to the transducer where pressure variations are converted into an electrical signal. Ultrasound imaging is potentially inexpensive, especially compared to alternative technologies such as magnetic resonance imaging and computerized tomography. Current abdominal transducers and arrays typically operate in the 1-5 MHz frequency range, while specialty single-element transducers for detection of skin and eye ailments range from 30-100 MHz.

For imaging applications, an array of transducers is desirable, such as a one-dimensional or two-dimensional array. Conventional transducer arrays are fabricated by dicing bulk piezoelectric ceramics or single crystals with a diamond saw. Realistic machining tolerances limit the kerf (gap spacing between adjacent transducer elements) to >40 microns. The element spacing is typically lambda/2, where lambda is the acoustic wavelength, so that current transducer fabrication technologies limit transducer arrays to frequencies of less than about 20 MHz. Lateral resolution is proportional to wavelength and inversely proportional to transducer or array aperture. Thus, the higher the transducer frequency, the higher the lateral resolution.

A single ultrasound transducer may typically comprise a piezoelectric material, first and second electrodes positioned to apply an electric field to the piezoelectric material, a backing material, and a matching layer. A backing layer can be used to stop sound waves launched from the rear of the transducer from reflecting back and interfering with outgoing signals. A matching layer improves coupling of ultrasound energy between the transducer and the target material. The transducer typically has a resonance frequency at which the coupling coefficient is highest. In many applications the resonance frequency is determined mainly by the thickness of the piezoelectric element.

Beam steering generally requires that the transducer pitch be on the order of the ultrasound wavelength within the propagating medium to avoid grating lobe artifacts. Previous approaches have included laser micromachining of materials, however this approach has various problems including ceramic degradation at powers required for reasonable process time. Also, the kerf spacing (gap spacing between adjacent transducer elements) is preferably less than half the ultrasound wavelength to avoid lateral coupling between transducer elements.

A 50 megahertz phased array capable of electronic steering and focusing would require transducer elements with a 15 micron pitch separated by 5 micron kerfs. Such small kerfs cannot presently be achieved using a mechanical dicing technique. Current manufacturing techniques cannot achieve the frequency range of 50 megahertz to 1 gigahertz. However, there are many applications for higher frequencies, for example to obtain higher resolution images.

Hence new approaches are desirable to obtain improved high frequency ultrasound transducer arrays.

SUMMARY OF THE INVENTION

Embodiments of the present invention include ultrasound transducer arrays with high frequency operation, for example in the range 50 megahertz to 1 gigahertz. Such ultrasound arrays have numerous applications, including medical imaging (such as cancer detection, imaging of organs, and the like), and also detecting defects in electronic integrated circuits. Examples include devices having drive voltages below 10 volts, allowing integration with digital electronic circuitry.

In some examples, transducer arrays were formed on a substrate using transducer elements having a generally elongated form. In some examples, a transducer element comprises a generally cylindrical inner core, a generally tubular piezoelectric material, and an outer electrode also having a generally tubular form, the inner core, piezoelectric layer, and outer electrode being generally concentric.

These configurations allow the electronic signal to be applied across the thickness of a piezoelectric film, which may be 1 micron or less. Hence drive voltages less than approximately 10 volts are readily achievable, allowing integration of ultrasound transducer arrays with CMOS or TTL electronic drive circuitry.

An improved process for fabricating an ultrasound transducer array comprises providing a template and depositing one or more conformal layers on the template. In some example, the template includes protrusions, such as pillars extending away from a substrate. The pillars may be generally cylindrical, or other shape, and may be used as an electrode. In other examples, the template may include pores, such as generally cylindrical pores, and may subsequently be removed by etching.

In some examples, a mold replication approach was used that allows fabrication of transducer arrays with center-to-center spacing of the piezoelectric transducer elements at half the acoustic wavelength, enabling operating frequencies up to 1 GHz. This allows true three-dimensional phased array imaging to be performed at frequencies where, to date, only single element mechanically scanned devices are available, or no devices of any kind are available. This approach, combined with novel electrode structures, allows low-voltage transducer operation (<5 V compared to ~100 V for conventional sensors).

In some examples, an array of pillars is used as a template, and a conformal layer of piezoelectric material is formed on the pillars. The pillars can then be used as an inner core electrode and the deposited layer of piezoelectric material can then be coated with a second outer electrode layer. An electronic drive signal can then be applied between the inner core and outer electrode. In other examples, the template comprises a mold having small diameter, deep (relative to the diameter) pores therein. One or more electrode and piezoelectric layers are then coated within the pores to provide an essentially concentric tubular structure of electrodes and piezoelectric layer.

In other examples an array of ultrasound transducers comprise generally T-shaped structures (viewed in cross-section), in which the piezoelectric material resonates without complete attachment to the substrate. These structures may be termed xylophone structures. Example transducers include a sandwich structure (a generally planar layered structure) comprising first and second electrodes separated by a thin film of piezoelectric material. The sandwich structure may be partially separated from the substrate, for example being attached to the substrate through a support having a cross-sectional area less than the area of the sandwich structure, for example at least 10% less, in some cases at least 20% less. In other examples, the sandwich structure is not separated from the substrate. The sandwich structure may be elongated, for example being generally rectangular in the plane of the substrate and having a width less than half the length. The width may be less than 200 microns, for example in the range 1 micron to 200 microns. A one-dimensional array may comprise a plurality of such transducers, the transducers being elongated in a direction orthogonal to the direction of the array.

Embodiments of the present invention include transducer arrays comprising thin films of a piezoelectric material, for example films having a thickness of less than 10 microns, such as approximately 1 micron or less. To induce an ultrasound signal, an electric signal is applied across the film thickness. Hence, voltages are much reduced compared with devices where voltages are applied across greater distances. The piezoelectric film may be part of a microstructure having a resonance frequency. The resonance frequency can be determined by the configuration and dimensions of the microstructure, including electrode structures or other components.

DETAILED DESCRIPTION OF THE PREFERRED EMBODIMENTS

Figure 1:
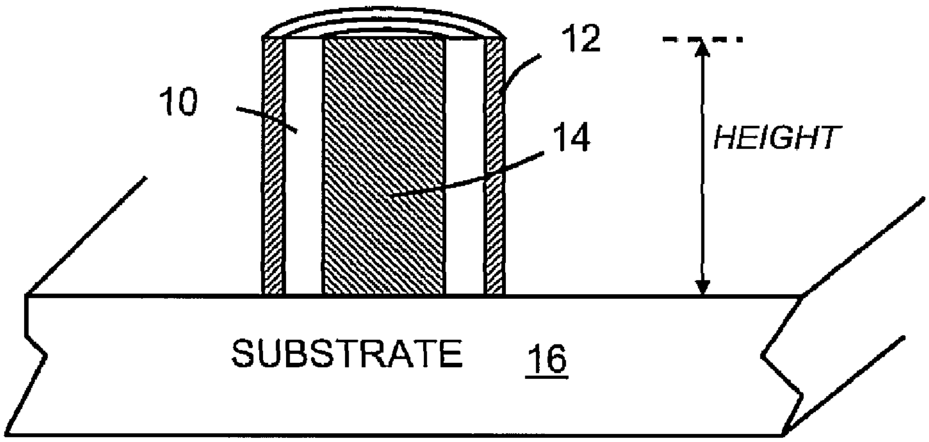
FIG. 1 shows an elongate ultrasound transducer supported on a substrate.

Example improved ultrasound transducer arrays were developed which are scalable in frequency (from the MHz to the GHz frequency range) and may include an integrated or close-coupled electronics platform. Embodiments of the present invention include ultrasound transducer elements with high aspect ratio and thin ferroelectric structures prepared by conformal coating of patterned templates. This enables preparation of piezoelectric structures which may be, for example, microns to hundreds of microns tall and between 0.1 microns to several microns in lateral dimension. The small size facilitates high frequency operation.

Piezoelectric structures can be thin ferroelectric films (for example, having a film thickness between approximately 10 nm and approximately 10 microns, more particularly between approximately 50 nm and approximately 5 microns), which allows low voltage operation and direct coupling with integrated circuit based control electronics. In this context, low voltages are substantially less than 100V, particularly less than 20 volts, and more particularly less than 10V. A voltage of approximately 5V is possible, allowing a digital electronic circuit such as a TTL or CMOS IC to be used, and without the need for drive voltage amplification. With independent control of each piezoelectric element, it is possible to focus the beam in 2 dimensions as well as beam steer. There is currently no alternative technology which enables this low voltage operation with an operating frequency (the frequency of ultrasound generated and/or detected) between 50 MHz and 1 GHz.

Novel fabrication processes were developed to make high aspect ratio structures, for example in 2 dimensional arrays, including high coupling coefficient piezoelectric materials. Embodiments of the present invention include improved high frequency ultrasound devices, such as one and two-dimensional arrays of transducers. Such devices may be used in high frequency applications, such as the 50 megahertz to 1 gigahertz frequency range, for a variety of applications such as tissue imaging and high resolution nondestructive testing. Examples include arrays formed from post-like and tube-like structures. An example transducer is elongated, and comprises an outer electrode, a substantially concentric piezoelectric layer, and an inner core electrode. Improved fabrication techniques were developed, including vacuum assisted infiltration of or mist deposition into a template, and the use of metal post arrays.

An electronic circuit was designed to drive a piezoelectric transducer array at electrical signal levels compatible with CMOS or TTL logic. The entire drive/receive circuitry for the transducer can be integrated into a CMOS platform that is close coupled to the transducer. High resolution transducers may be fabricated with either zero (e.g. wireless) or a limited number of external electrical connections. Transducer arrays according to the present invention can be used for high resolution ultrasonic imaging, for example ultrasound microscopy.

An example apparatus includes a plurality of ultrasound transducers, each ultrasound transducer comprising a first electrode, a second electrode, the first electrode and the second electrode having an electrode separation, a thin film comprising a piezoelectric material located between the first electrode and the second electrode, and a substrate supporting the plurality of ultrasound transducers. The electrode separation may be less than 10 microns, more particularly between approximately 50 nm and approximately 5 microns, the electrode separation being approximately equal to the film thickness. The first electrode may comprise a pillar extending away from the substrate, such as a post (a solid pillar), tube, or other elongated structure. The pillar may be generally normal to the substrate. The thin film may generally tubular and disposed around the first electrode, for example deposited by a conformal process onto the first electrodes. The thin film may have a generally tubular form extending away from the substrate, the first electrode being located within the generally tubular form. The second electrode may be generally tubular, and the second electrode, the thin film, and the first electrode may be generally concentric within a cylindrical structure extending away from the substrate, so that an electric field applied between the first and second electrodes is generally parallel to the substrate along most or all of the length of the structure.

Each transducer may comprise a multilayer structure including the first electrode, the thin film, and the second electrode. The multilayer structure may be generally planar in form and generally parallel to the substrate, and in some examples is partially released from the substrate. A multilayer structure may attach to the substrate through a support, the support having a narrowed cross-sectional area, such as at least 10% less than the area of the structure.

In other examples, a generally planar multilayer structure may be generally perpendicular to the substrate, so that applied electric fields are generally parallel to the substrate.

FIG. 1 shows an example transducer, comprising piezoelectric material 10, inner electrode 14, and outer electrode 12. The piezoelectric material is in the form of a thin film surrounding the inner electrode. The transducer is supported on substrate 16. Electrical connections to the inner and outer electrodes allow an electric field to be applied orthogonal to the main central axis of the structure. This has the advantage that the electric field is applied across the thickness of the essentially tubular piezoelectric layer. The thickness may be much less than the height and radius of the structure, allowing higher electric field strengths for a given applied voltage. In conventional devices, the electric field is generally applied parallel to the long axis of such elongated structures such as piezoelectric posts, and the electric field strength is much reduced. Hence, conventional devices require higher applied voltages for the same electric field strengths achieved using structures according to embodiments of the present invention. The inner core may be a metal post, other conducting post, conducting tube, or similar structure capable of applying a radial electric field through the piezoelectric layer 10. The outer electrode is, in this example, substantially tubular and the inner, outer, and piezoelectric layers are substantially concentric.

Use of inner and outer electrodes on each elongated piezoelectric element greatly reduces the required transducer drive voltage relative to a transducer with electrodes on the top and bottom surfaces. For example, a 50 MHz transducer using such a configuration can be driven at 5V or less, rather than the 60-100 V characteristic of conventional piezoelectric elements driven using voltages applied between the top to the bottom. Lower voltages enable compatibility with standard CMOS circuitry, allowing integration or close-coupling of transducer arrays and electronic circuitry. This decreases or eliminates cabling requirements for transducer arrays, including handheld devices. Applications of miniaturized devices include catheter applications, such as ultrasound imaging of plaque build-up in the blood vessels around the heart or probes to investigate tissues during biopsies or surgery. Similarly, these devices could be employed in pill cameras.

Arrays of high piezoelectric coefficient elements can be made at various lateral size scales. In some examples, the height (or length) of a piezoelectric element is at least twice its lateral dimension, enabling a pure thickness extensional mode of the device to be excited. The transducer spacing can be approximately half the acoustic wavelength, which is not particularly difficult for low frequency transducers, but it is difficult to reduce the gap between elements below ~40 microns using conventional dicing methods. For a 50 MHz transducer, however, a transducer pitch of approximately 15 microns may be used.

Using conventional top-down processing techniques, such as dicing, it may also difficult to make trenches in films that allow the aspect ratios desired for an ultrasound transducer. This may be a serious impediment in making high frequency 1D or 2D array transducers. Here, novel approaches for making the array transducers were demonstrated that allow reduced transducer pitch, high aspect ratios, and high frequency operation.

In an example process, the transducer core is provided by a pillar, such as a metal post. Arrays of metal posts can be fabricated on the substrate, and the piezoelectric layer applied through a conformal layer forming process. The outer electrode can be then applied using a similar or different conformal layer forming process. In this and similar approaches, the structure is built up from the central post by applications of one or more additional layers.

In other approaches to obtaining a structure similar to that shown in FIG. 1, a template or mold is used, to enable infiltration of the pore array with the piezoelectric and electrode layers.

Template Including a Pore Array

Figure 2A:
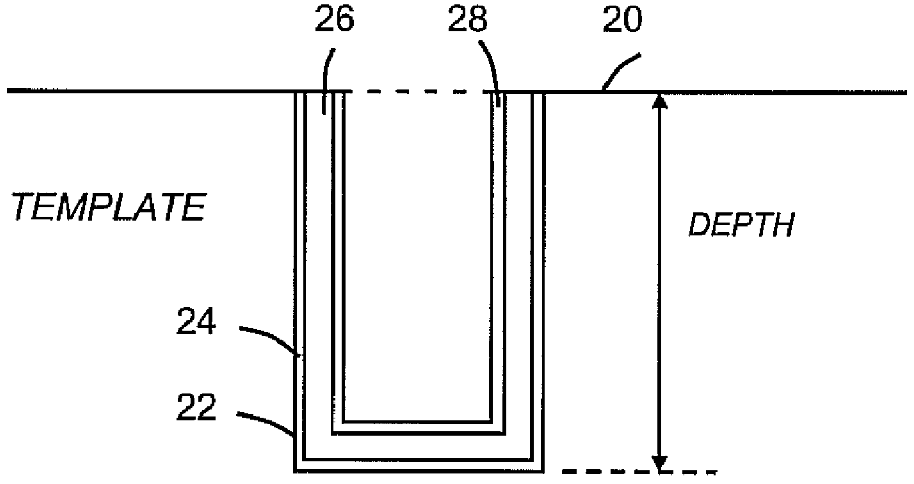
FIGS. 2A and 2B illustrate a fabrication process comprising conformal layer coatings on a template comprising pores.
Figure 2B:
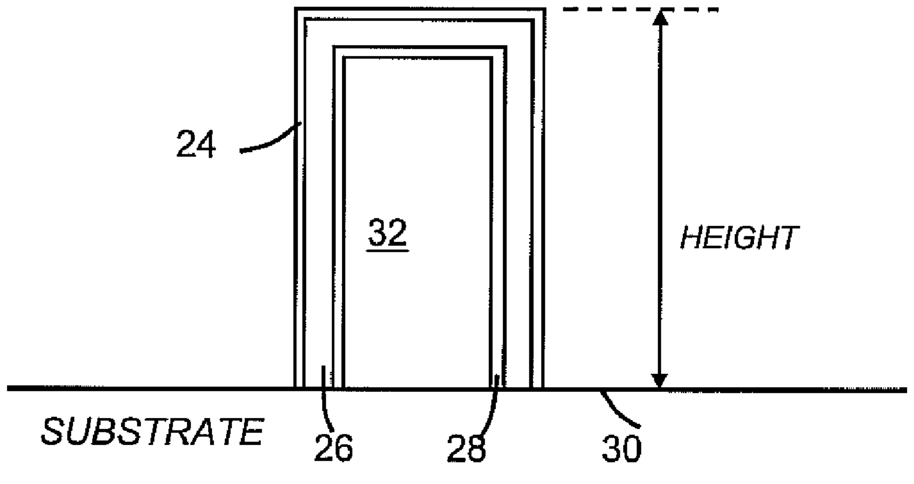

FIG. 2A shows an elongated pore 22 formed in the surface of a template 20. Layers 24, 26, and 28 are formed within the interior of the hole or pore. In a representative example layers 24 and 28 are electrodes, and layer 26 is a piezoelectric layer. The template can be removed by etching or other removal process after fabrication of a multilayer structure leaving an elongated structure as shown in FIG. 21. FIG. 2B shows the layer 24 functioning as an outer electrode, piezoelectric layer 26, and an inner electrode formed by layer 28. In this example the layer 28 may be in the form a conducting tube or post-like structure, and may be formed by the processes described in more detail below. In other examples, the outer electrode 24 may be formed after etching away the template 20. FIG. 2B shows a substrate supporting the structures formed using template 20, which in this example has been removed by etching, for example after deposition of a substrate layer. The interior volume 32 may be air, the same material as the inner electrode, other electrically conducting post, a solid insulator, and the like.

Figure 2C:
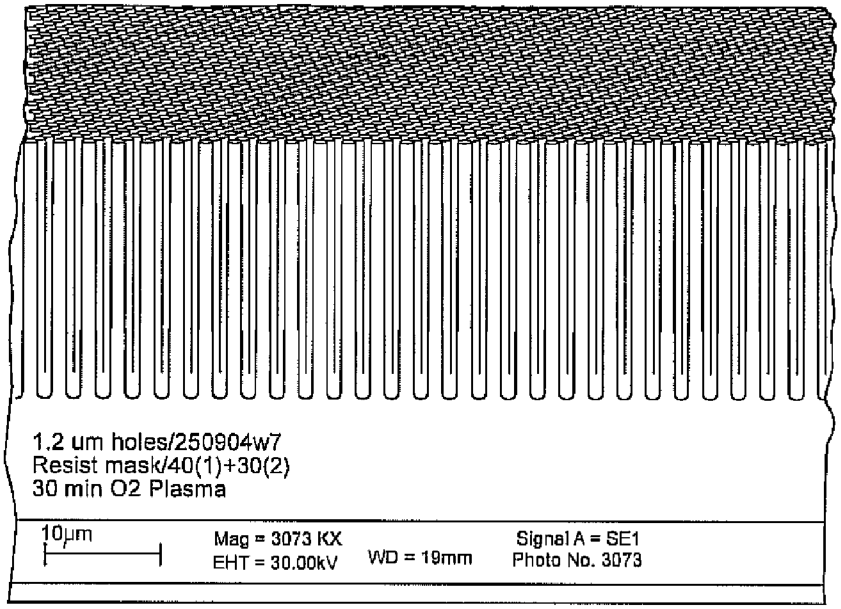
FIG. 2C illustrates a porous template useful for array fabrication.

FIG. 2C further illustrates a silicon template having pores useful for transducer array fabrication, provided by Norcoda Inc. of Edmonton, Canada.

By infusing a gel in the template, removing the template, and annealing, crystallized nano/microstructures were obtained. Electrode/piezoelectric film/electrode transducer elements were fabricated using vacuum infiltration, using $LaNiO_3$ (lanthanum nickelate) as an oxide electrode for making the electrical interconnections, and $PbZr_{1-x}Ti_xO_3$ (PZT) as a piezoelectric material with high piezoelectric activity. After infiltration and pyrolysis, the Si mold can be removed using an isotropic $XeF_2$ release process, and the films crystallized.

Prefabricated macroporous silicon templates were obtained from Philips Research Laboratories of Eindhoven, The Netherlands, and from Norcoda Inc. of Edmonton, Canada. For some examples, macroporous silicon having pores with an aspect ratio of 25:1 obtained from Philips Research Labs., Eindhoven, Netherlands was used. These templates were fabricated using deep reactive ion etch processes. The pores had a diameter of between 1.8 and 2 microns, with a pitch of 1.5 microns. A surface layer, possibly a native oxide layer, was removed using either 2 to 3 minutes of reactive ion etching ($CF_4/O_2$) and/or vacuum assisted infiltration of buffered oxide etch (10:1).

The spacing and height of the piezoelectric elements is determined by the pore structure developed in the Si template, and can be controlled by photolithography. Arrays of $LaNiO_3$/PZT tubes were prepared by vacuum infiltration of pores in the silicon template, and development of the correct phase was confirmed by X-ray diffraction and transmission electron microscopy.

Figure 3:
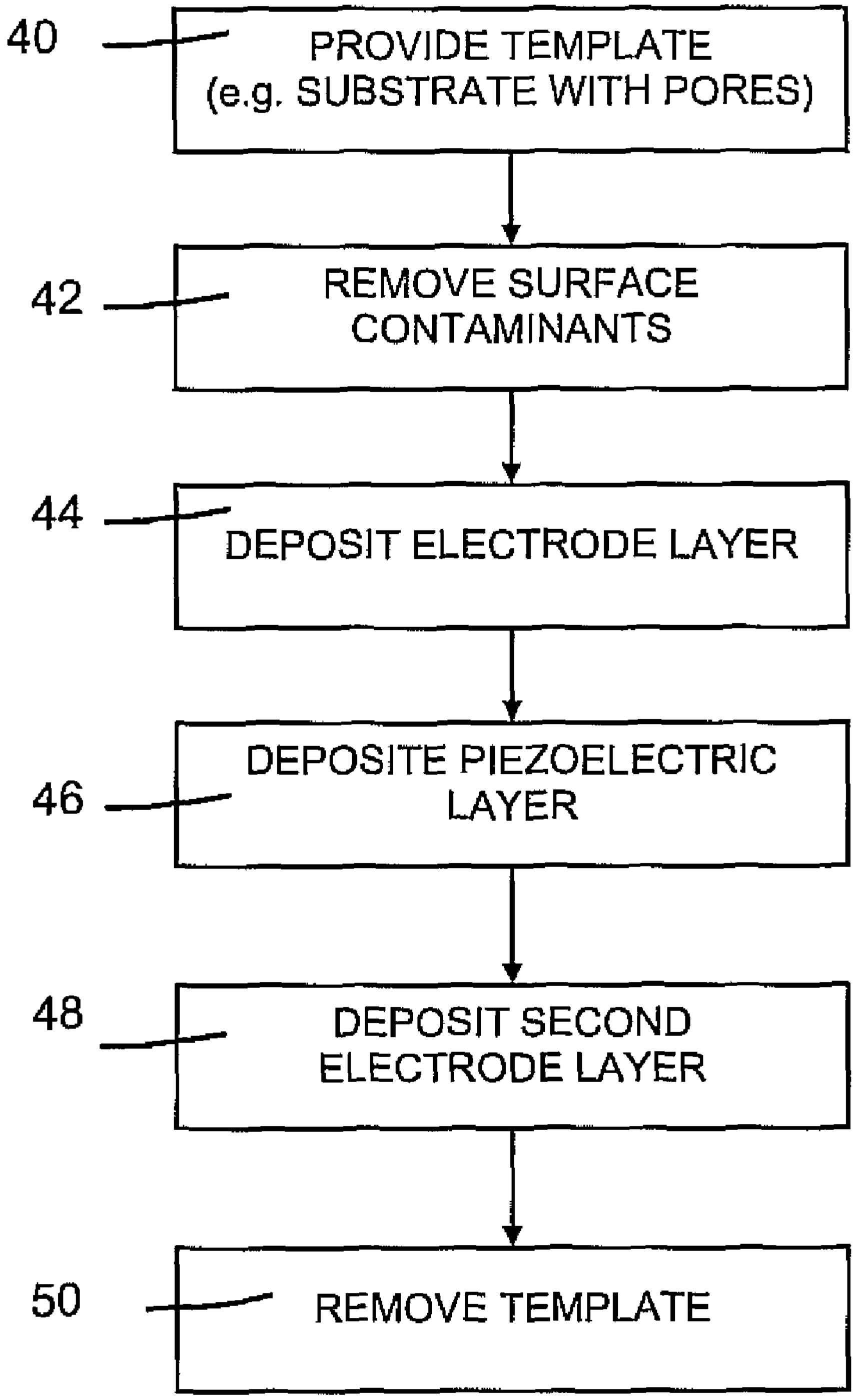
FIG. 3 is a flowchart illustrating a process for fabricating an ultrasound transducer array.

FIG. 3 shows a flow diagram for fabrication of an ultrasound transducer array using an infiltration technique. Box 40 comprises providing a template having an array of pores formed in the surface thereof. Box 42 comprises a cleaning step, for example removing surface contaminants from the template. Box 44 corresponds to depositing what will become the outer electrode layer. In specific examples, the outer electrode was formed using lanthanum nickel oxide (or lanthanum nickelate), $LaNiO_3$, a conductive oxide. A vacuum of approximately 15 psi was used for infiltration of the pores with the nickelate solution. After deposition of the outer electrode, box 46 corresponds to deposition of the piezoelectric layer. A suitable material is PZT (lead zirconium titanate, a ferroelectric material with a high dielectric constant). Box 48 corresponds to deposition of the inner electrode layer, and again in specific examples lanthanum nickelate was used.

The resulting structure is generally tubular with an air core. The central air core may be filled with another material as required. The PZT is sandwiched between two conducting layers (inner and outer electrodes), allowing the structure to be used as a piezoelectric transducer on application of an electrical bias between the inner and outer electrodes. Box 50 corresponds to removal of the template. Using a silicon template, xenon difluoride can be used to remove the silicon.

Figure 4:
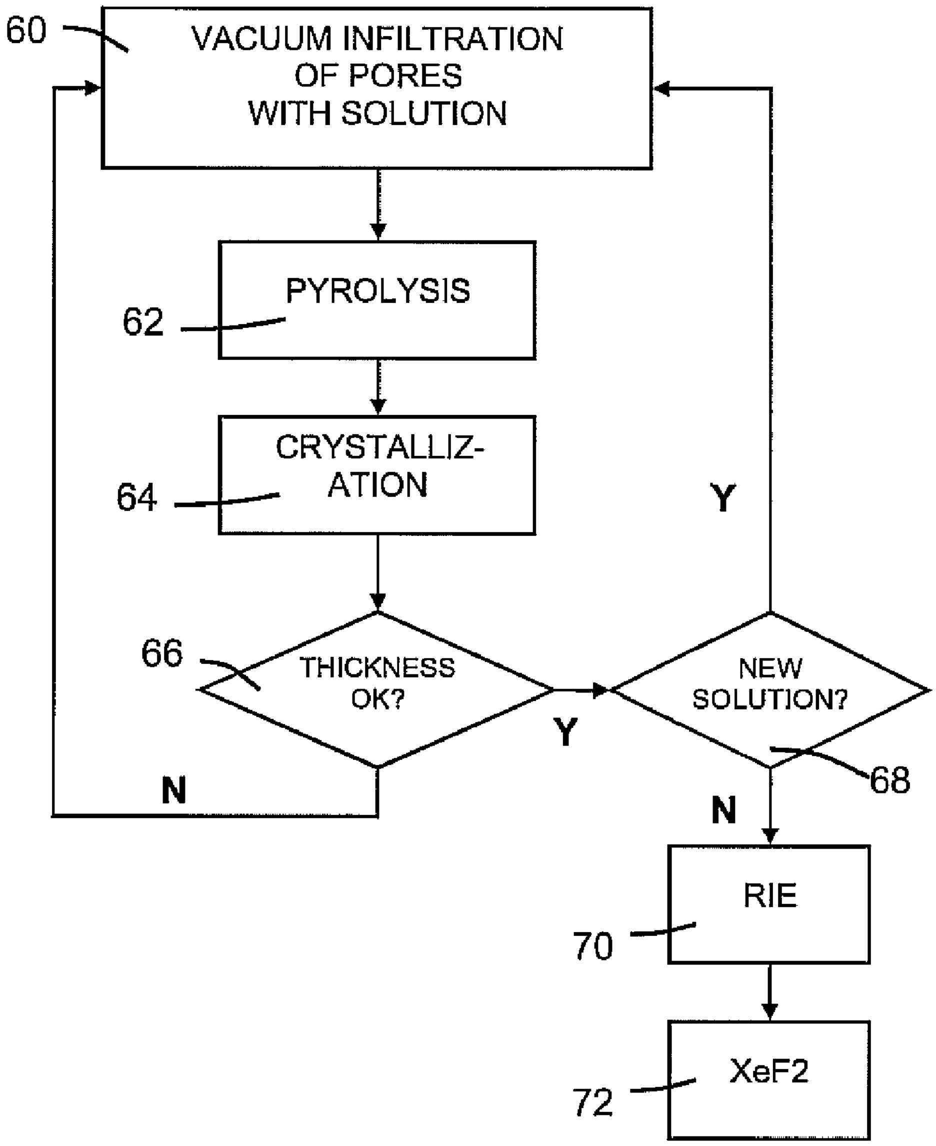
FIG. 4 is a flowchart illustrating an example process using PZT and a silicon template.

FIG. 4 shows a specific example used to fabricate a transducer array. Box 60 corresponds to infiltration of a porous silicon template using either a lanthanum nickelate or PZT solution. Box 62 corresponds to pyrolysis so as to form a layer on the interior of the tube (and on any other previous layers formed). For lanthanum nickelate, pyrolysis was performed at 300° C. for approximately 2 minutes, and 4 layers were deposited to obtain the inner or outer electrode layers. For PZT pyrolysis was performed at 300° C. for approximately 2 minutes, and 4 layers were formed to obtain the piezoelectric layer of the device. After pyrolysis crystallization was obtained at a higher temperature, 750° C. in the case of the nickelate layer and 650° C. in the case of PZT. Box 64 corresponds to the crystallization step. Box 66 corresponds to deciding whether the layer thickness is sufficient or not, if not the template is infiltrated with a solution again at 60 or if the sufficient thickness has been obtained the process is repeated again but with a different solution. Box 68 corresponds to repetition with the other solution. Once the final structure is obtained RIE (70) and $XeF_2$ (72) etching steps are used to remove the silicon template.

Figure 5:
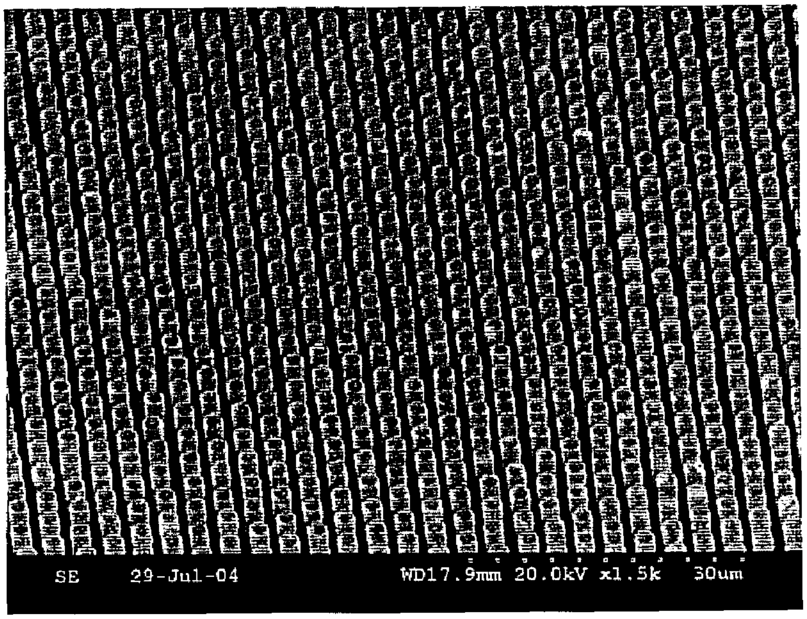
FIG. 5 is an electron micrograph showing an array of PZT tubes prepared by mold infiltration.

FIG. 5 is a micrograph of an array of $LaNiO_3$/PZT tubes prepared by successive infiltrations of a silicon mold, first with $LaNiO_3$ and then with PZT solutions. After infiltration and pyrolysis, the Si mold was removed using a $XeF_2$ release process, and the firms crystallized. The resulting films showed good phase purity, and enable fabrication of electrode/piezoelectric/electrode stacks which meet the aspect ratio and spacing requirements for high frequency ultrasound devices while simultaneously allowing low drive voltages. Such low drive voltages are possible since the transducer element can now be driven through the thickness of the piezoelectric wall, rather than from top to bottom as is necessary in conventional transducers. The use of low voltage transmit pulses greatly simplifies implementation of the transmit/receive electronics in a CMOS platform.

Improved crystallinity of the tubes was subsequently obtained using two-step crystallization of the lanthanum nickelate based electrode layers, one at 650° C. and a second at 750° C.

Vacuum infiltration of porous silicon molds allows effective fabrication of high aspect ratio piezoelectric transducers with reasonable phase purity. After formation of a tube with the desired wall thickness, the silicon template can be removed using $XeF_2$ etching. The tubes may remain on the silicon template, or another substrate provided.

Metal contacts may be provided on the outer and inner surfaces of the tubes. For example, the inner electrode may itself be a metal tube, such as a Pd tube. Piezoelectric films may be formed using an inner electrode structure as a template.

Template Including a Pillar Array

Figure 6:
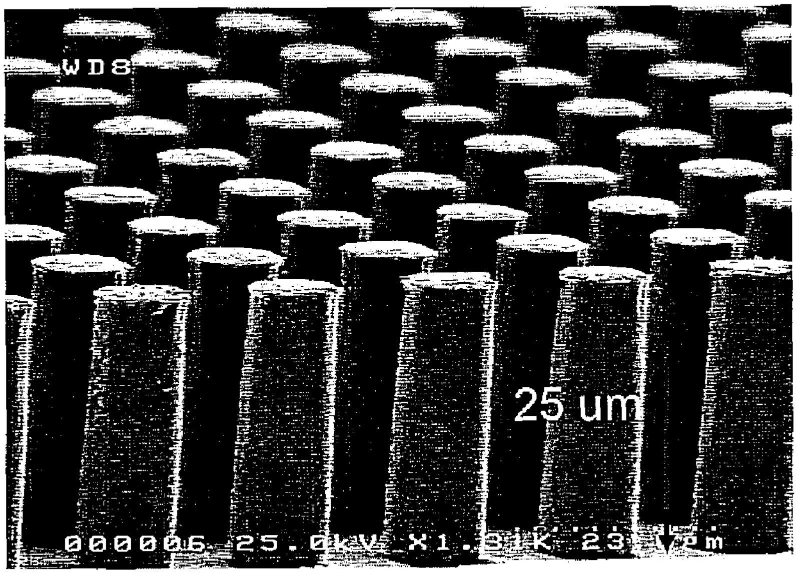
FIG. 6 is a micrograph showing an array of metal pillars used as a template.

FIG. 6 shows an electron micrograph of metal pillars formed on a substrate. These metal pillar arrays were used as a template for formation of ultrasound transducer arrays, the metal pillars acting as an inner core electrode.

An example method of fabricating such pillars comprises electrodeposition of metal posts on to metal pads supported by a substrate, using a patterned photoresist layer (such as SUS) on the substrate. The photoresist layer may be ~40 micron thick, to obtain posts of a height approximately equal to the resist layer. The photoresist layer is then removed, leaving metal posts extending from the substrate. A multilayer structure, such as inner electrode/piezoelectric/outer electrode (e.g. Pt/$LaNiO_3$/PZT/$LaNiO_3$) can then be deposited on the post by mist deposition, or other deposition technique. The metal post may serve as the inner electrode. The piezoelectric film is then further patterning to expose interconnects, and a seed metal deposited to allow contacts to outer $LaNiO_3$ electrode on transducer, and plating of outer contacts gives a transducer with inner and outer contacts to each pixel.

Figure 7:
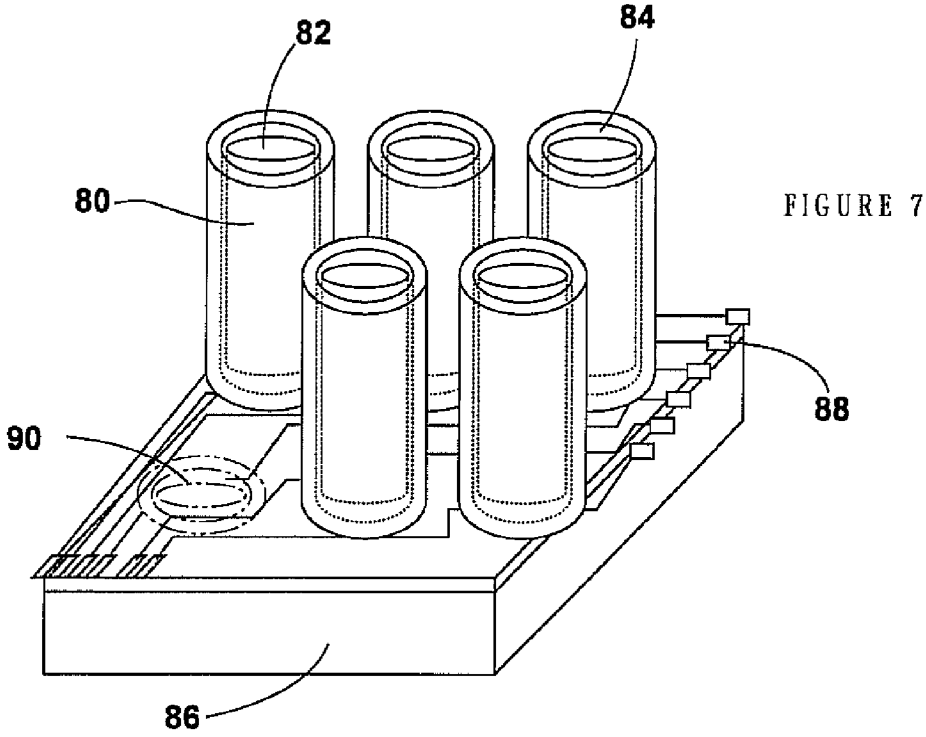
FIG. 7 illustrates the geometry of a post array.

FIG. 7 illustrates the general geometry of an example device in the form of an ultrasound transducer array. Each transducer element comprises an outer electrode 80, inner electrode 82, and piezoelectric layer 84. The transducers are supported on substrate 86, with contact pads 88 allowing electrical connection to inner and outer electrodes as shown at 90 (base outline of transducer shown). A similar structure was modeled, having a metal post diameter (inner electrode diameter) of 8 microns, a piezoelectric film (PZT) wall thickness of 1 micron, an outer diameter of 10 microns, a pitch (center-to-center) of 15 microns, and a kerf (edge to edge gap spacing) of 3 microns. Modeling using finite element analysis (FEA) using a program called PZFLex showed a resonance at 50 megahertz, with a post height of 41 microns. A 1 micron film of PZT is easily obtained using, for example, sol gel deposition. The pitch was chosen to be 15 microns, so that it is less than half the wavelength in the medium to be imaged (for example a human body), and in order to enable electronic beam steering and focusing.

Figure 8:
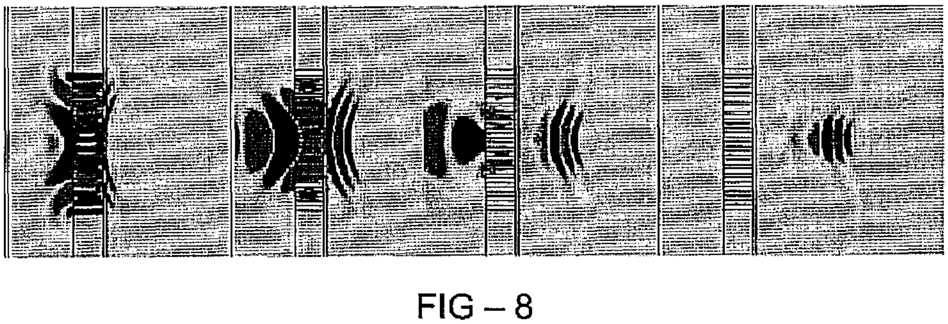
FIG. 8 shows a simulation of ultrasound production by a two-dimensional array of ultrasound transducers, based on a post array.

FIG. 8 illustrates simulated time dependent data for a generated ultrasound pulse. This simulation assumes 30 individual elements, ultrasound being triggered with a 3 volt pulse at 50 megahertz.

Figure 9:
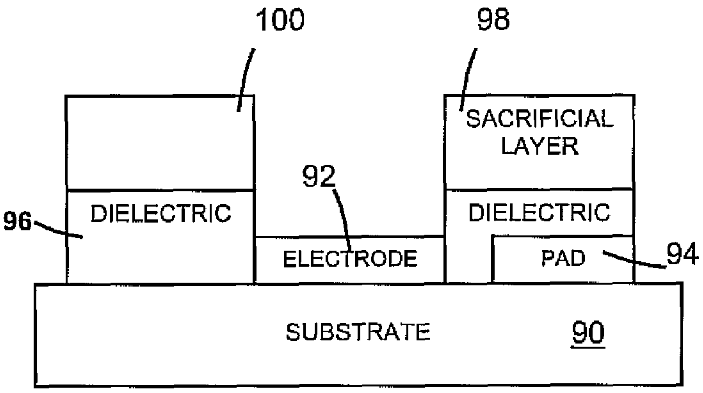
FIG. 9 illustrates a substrate allowing electrodeposition of post material and electrical connections to inner and outer electrodes.

FIG. 9 is a side view of a possible substrate structure for a post. The substrate comprises a substrate material 90, an inner electrode 92, an inner contact pad 94, a dielectric layer 96, and a sacrificial layer 98. For example, the inner electrode may be a nickel post, the dielectric layer may be magnesium oxide, titanium dioxide, silicon nitride, or similar, and the outer electrode 100 may be a metal film.

Figure 10A:
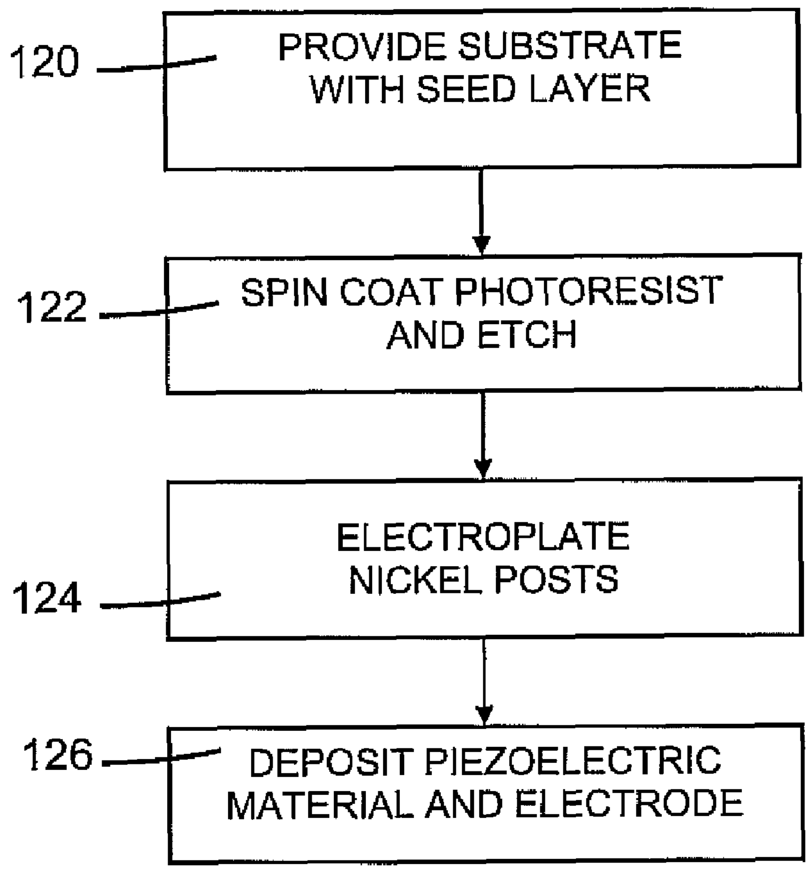
FIGS. 10A-10C show a fabrication process using a post array to obtain an array of ultrasound transducers.

FIG. 10A shows a multistep process for fabrication of an ultrasound transducer array using metal posts. Box 120 represents the deposition of seed layers for nickel post electroplating and deposition of dielectric and sacrificial layers. Box 122 corresponds to coating of a photoresist layer and etching thereof. Box 124 corresponds to electroplating deposition of a nickel post, and Box 126 corresponds to subsequent PZT and metal deposition onto the template so provided. Further processing may be used to fabricate an outer electrode contact.

Figure 10B:
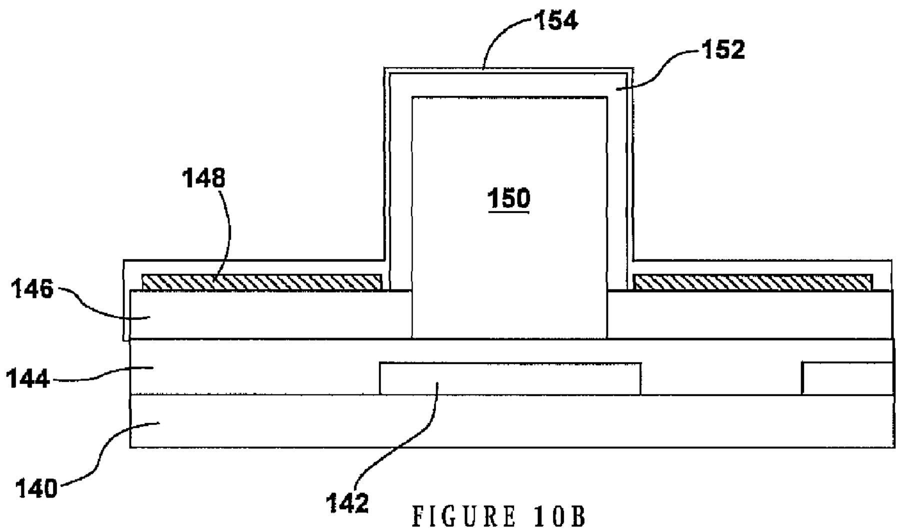

FIG. 10B shows an illustration of the structure obtained comprising substrate 140, dielectric layer 144, seed layer for the nickel post 142, sacrificial layer 146, photoresist layer 148, metal post 150, PZT layer 152, and outer electrode layer 154. In this example, referring again to FIG. 10A, box 126 corresponds to lifting off the sacrificial layer, which leaves the nickel post extending from the substrate, the post supporting a PZT layer and an outer electrode layer. An outer electrode can either be connected to the exterior of the outer electrode layer 154 at the top of the post, for example by filling in the gaps between the coated posts using a dielectric layer such as a cured photoresist or other material. Alternatively contact can be made to the outer electrode layer by electroplating after removal of the first photoresist layer.

Figure 10C:
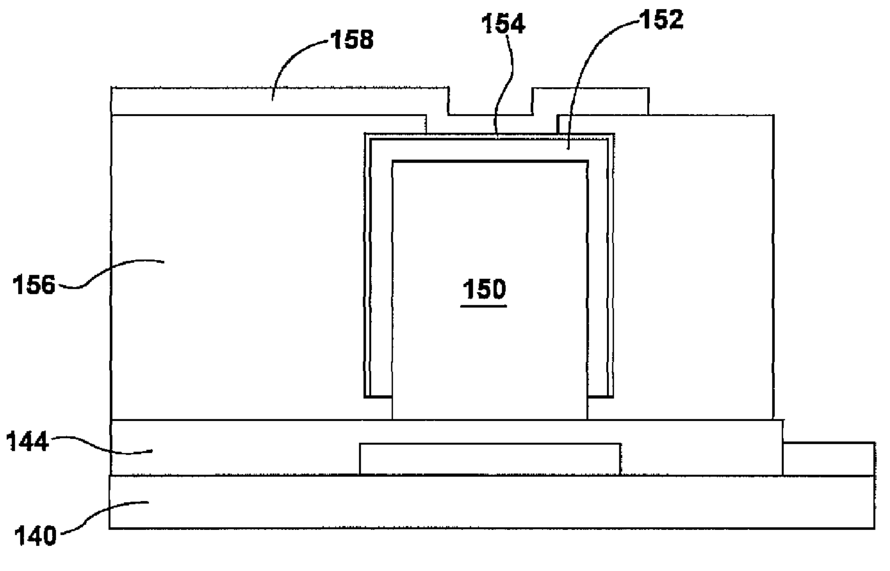
Figure 11:
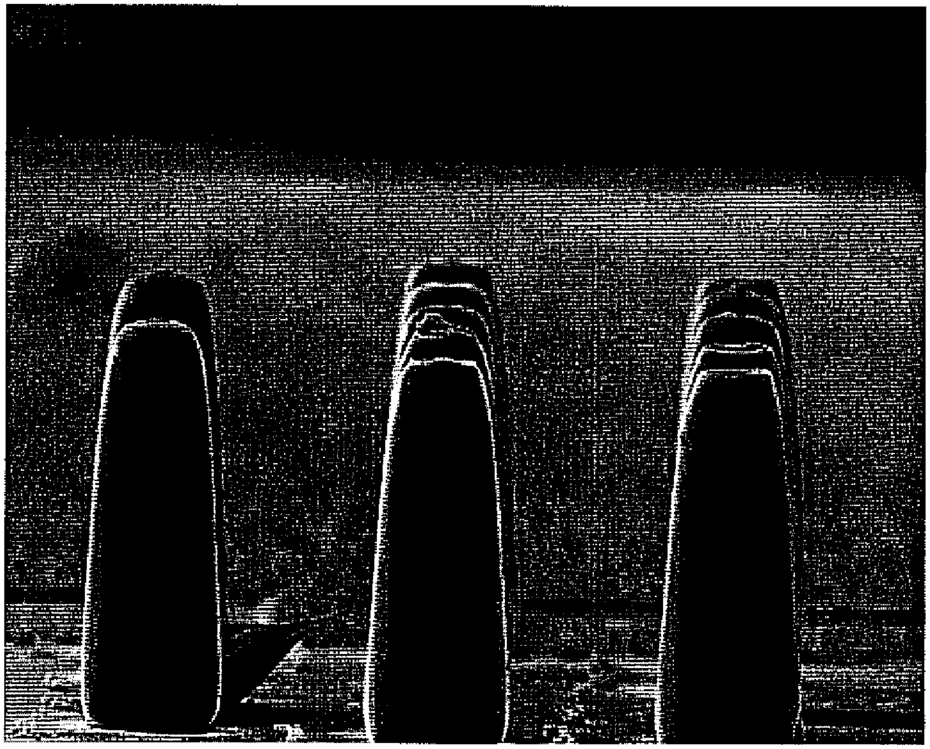
FIG. 11 is an electron micrograph showing PZT coated metal pillars fabricated according to a process according to the present invention.

FIG. 10C shows a possible final structure. This structure is similar to that shown in FIG. 10B and further comprising dielectric layer 156, which may be a cured photoresist and electrode contact 158 which contacts the outer electrode 154 of the post structure. In other examples the portion of the coated post at the top of the post can be removed by etching, so that the piezoelectric layer and outer electrode layer remain only on the sides of the post. In such an example, a contact to the outer electrode can be made through electroplating on the dielectric layer 146.

The posts or pillars used for formation of the transducer array may comprise any conducting material. For example the posts may be metal such as a noble metal (Au, Ag, Pt), or a base metal such as nickel or copper, as well as a multilayer structure of a base metal and a noble metal. In experiments, platinum electro-deposition occurred fairly slowly, and nickel was chosen for the post materials. However, this is only an example and other metals or alloys can be used.

Nickel has a propensity to oxidize at high temperatures at moderate partial pressures of oxygen, and this can lead to reduction of lead within the PZT. Thermodynamically, it may not be possible for PbO and Ni to coexist. Such problems can be avoided by coating the nickel foils with a noble metal, such as platinum. A higher partial pressure of oxygen during pyrolysis facilitates removal of organic materials from the deposited film.

Experiments were conducted with nickel foil, the foil being plated with platinum by immersing into a solution of platinum in hydrochloric acid (1000 micrograms per milliliter of Pt in 5% HCl). A combination of plating and sputtering was found to give excellent coating of the nickel film.

In relation to ultrasound transducer arrays using metal posts, an interfacial layer can be used between the bulk material of the post and the piezoelectric layer (such as PZT) to prevent degradation of the piezoelectric layer by the bulk post material. This allows the bulk of the post to be fabricated using a lower cost metal, and a relatively small amount of interfacial material to be used. Hence the interfacial material can be a relatively expensive noble metal such as silver, gold, palladium, or platinum, as well as oxide electrodes.

Example post structures were fabricated by conformal coating of nickel metal pillars, though other pillar materials may be used. In specific examples, nickel posts about 40 microns in height, 10 microns in diameter with a 15 micron pitch were used, with the metal posts acting as the inner electrodes. Transducer elements may be electrically addressed using electrical interconnects on the substrate. The piezoelectric material may be PZT, such as $PbZr_{0.52}Ti_{0.48}O_3$, which can be deposited using mist deposition. The crystallization of PZT on the Ni/Pt substrates was investigated, and it was found that use of a 100 nm thick Pt passivation layer on nickel facilitated perovskite PZT films to be deposited without second phases, as determined by X-ray diffraction and transmission electron microscopy. Other noble metal plated base metal posts may also be used. In other examples, posts may be non-electrically conducting, and generally tubular inner electrodes deposited thereon.

The metal pillars (which may be posts, tubes, or other structures) may be elongated, for example having a height at least three times greater than the diameter. The pillars can be coated with a piezoelectric thin film, and subsequently an outer electrode deposited. In the case of circular cross-section posts, the inner electrode, thin film, and outer electrode may be substantially concentric. The pillar cross-section may be non-circular, such as oval, square, or other form. This fabrication scheme is highly scalable as it is straightforward to decrease the element pitch if a higher transducer wavelength is desired. Each element may be addressed individually, and one and two dimensional transducer arrays may be fabricated with frequencies ~2 orders of magnitude higher than is currently possible.

"Xylophone" Transducers

Other examples of the present invention include xylophone transducers. This term describes sandwich structures of a piezoelectric layer between two layers in which part of the structure is separated from the substrate.

Figure 12A:
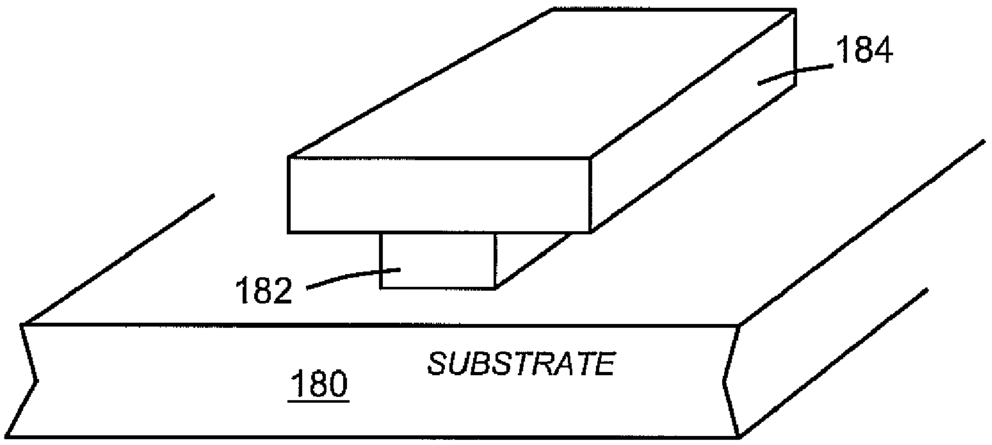
FIGS. 12A and 12B are schematics of a xylophone transducer.

FIG. 12A shows a simplified schematic, comprising substrate 180, support 182, and sandwich structure 184. In this case the sandwich structure comprises at least first and second electrodes with a piezoelectric material sandwiched between the first electrode and second electrode.

Figure 12B:
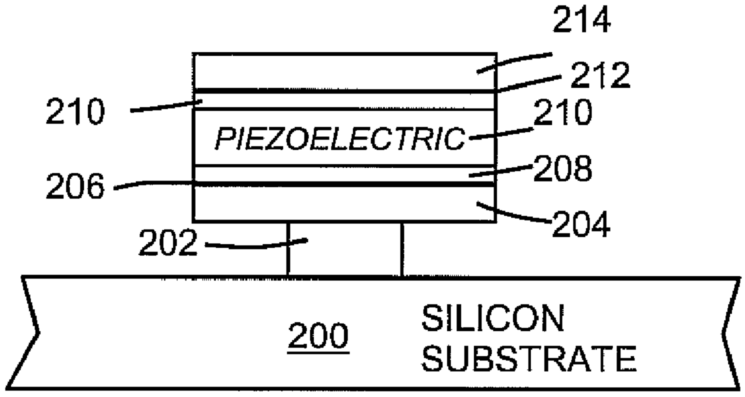

FIG. 12B shows a possible structure for a transducer. The structure comprises a silicon substrate 200, a silicon support 182, a dielectric layer of silica 184, a titanium adhesion layer 186, a platinum lower electrode 188, a piezoelectric layer 190, a platinum upper electrode 192, and an optional matching layer 194. A similar structure was modeled to determine ultrasound performance parameters. In the model the silicon substrate had a thickness of 300 microns, the silica backing layer had a thickness of 0.3 microns, the titanium adhesion layer had a thickness of 0.01 microns, the platinum lower electrode had a thickness of 0.05 microns, the piezoelectric layer (PZT) had a thickness of 0.5 microns, and the platinum top upper electrode bad a thickness of 0.05 microns. The matching layer, if used, may comprise parylene or other polymer, including filled polymers. The modeling results showed that the center frequency of the structure was approximately 50 megahertz.

Transducers were fabricated using a piezoelectric layer of PZT-8, having a thickness frequency constant of 1882 hertz meter. The lateral dimension of a device operating at 50 megahertz in width mode can be approximately 40 to 50 microns. To minimize interference between a length extension mode and the width vibration mode, finger lengths may be 150 microns or greater, for example in the range 150 to 1000 microns.

A one-dimensional transducer array of xylophone type elements was fabricated. Piezoelectric films of thicknesses in the range 0.4 to 0.6 microns were deposited on $Si/SiO_2/Ti/Pt$ wafers. Wafers are available commercially from Nova Electronic Materials Inc. of Richardson, Tex. The piezoelectric film deposition was achieved using spin coating. The spin coating was carried out at approximately 3000 rpm, each layer of 0.75 M PZT solution giving a layer thickness of between approximately 0.1 and 0.2 microns. Three to four layers were deposited to achieve the thickness of around 0.5 microns, with heat treatment after each layer deposition. The heat treatment comprised two pyrolysis steps at 1 minute each, at 250° C. and then at 350° to 400° C., and a crystallization step at 1 minute using an RTA at 670° C. in air. The 500 angstrom top platinum electrode was deposited using sputtering. The film so obtained was masked in the overall cross section of the transducer and etched as far down as the bottom platinum layer. A silicon nitride coating and patterned conducting vias were used to allow top electrode contact. A large bottom electrode pad was left uncovered to serve as the contact to the bottom electrode. The transducers were then partially released from the substrate to obtain a generally T bar shaped structure. The silica and silicon layers were then partially removed (laterally etched under the multilayer structure) using reactive ion etching (RIE) and xenon difluoride ($XeF_2$) etching.

For example devices, the dielectric properties measured on the device show a dielectric constant of 800-1500 at 1 KHz. The measured hysteresis loop shows values of polarization to be $P_r^+$~23.5 μC/cm$^2$, $P_r^-$~36 μC/cm$^2$, and the coercive field $E_c^+$~60 kV/cm, $E_c^-$~37 kV/cm. Piezoelectric thin films may be poled in situ, and alternating poling directions along a one dimensional array of transducers may be useful for spin echo imaging.

Figure 13A:
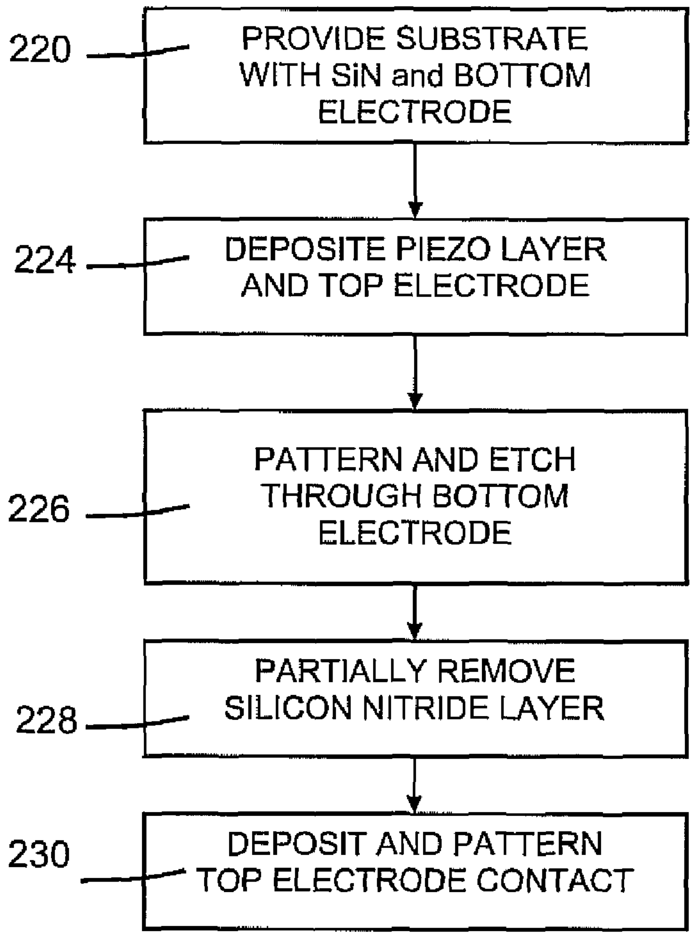
FIGS. 13A and 13B illustrates fabrication of xylophone transducers.
Figure 13B:
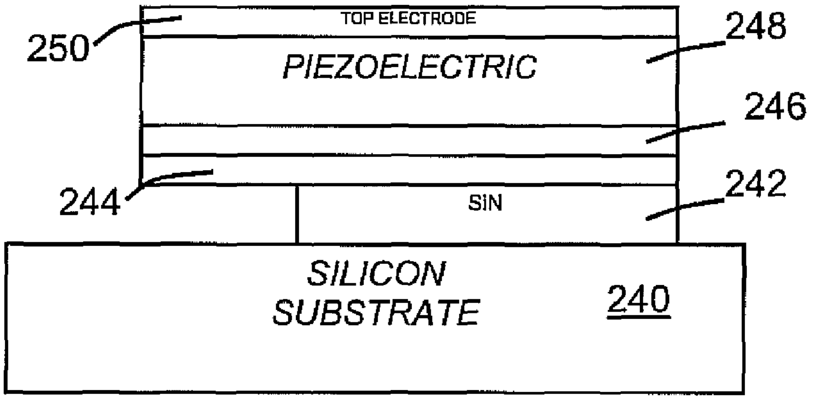

FIG. 13A shows a schematic process for forming a xylophone transducer. Box 220 comprises providing a substrate having silicon, silica and lower electrode layers. Box 222 corresponds to depositing a layer of piezoelectric material on the substrate, and further depositing a top electrode. Box 224 corresponds to patterning and etching through to the lower electrode level, the pattern being the general dimensions of the xylophone transducer. Box 226 corresponds to silicon nitride deposition and patterning. Box 228 corresponds to metal deposition and patterning of the top electrode. Box 230 corresponds to etching beneath the level of the lower electrode using $XeF_2$ or similar. FIG. 13B shows a possible configuration obtained at box 228. This shows the silicon substrate 240, silica layer 242, lower electrode 244, piezoelectric layer 248, top electrode 250, silicon nitride layer 252, top electrode contact 254, and lower electrode contact 256.

In a first example process, a micromachined one dimensional ultrasonic transducer array was fabricated, each transducer comprising a thin film of layer of lead zirconate titanate (PZT) PECVD silicon nitride deposition on a Si substrate, and an electrode and etch-mask metal layer were deposited by sputtering. A PZT layer was deposited by spin coating, followed by dry etching of PZT and the electrode structure. Dry etching of the silicon nitride layer was used for partial release of the transducer element from the substrate.

First, 3000 Å-thickness of silicon nitride ($Si_xN_y$, sometimes abbreviated SiN) was deposited by PECVD. Alternatively, silicon dioxide was grown thermally. Then, Ti (200 Å)/Pt (1000 Å) layers were deposited and patterned for the bottom electrodes. A PZT layer is deposited on the whole substrate and annealed. A top electrode was then deposited (preferably Pt or Ti/Pt). Silica or other materials may be used as a support in place of silicon nitride, and may provide improved metal adhesion. The bottom electrodes are patterned, Pt is etched by ion beam with Cr mask layer, and Ti wet etching is performed followed by Pt dry etching. The Si3N4 layer is then partially released using reactive ion etching to reduce the support area between transducer and the Si substrate. A fabricated transducer was measured by impedance analyzer to verify the dielectric constant of PZT layer, and a capacitance of 200 pF of capacitance was measured from 100 Hz to 5 MHz.

In another example process to fabricate a 1D transducer array, 0.4-0.6 μm thick PZT films were deposited on Si/SiO2/Ti/Pt wafers. Some wafers were 4" wafers purchased from Nova Electronic Materials, Inc., (Richardson, Tex.). Wafers were also fabricated in house; 2"wafers were made by thermally growing 3000 Å of $SiO_2$, and then sputtering a 300 Å Ti adhesion layer and ~700 Å of Pt electrode in a Kurt J. Lesker sputtering system. The Ti layer was deposited at 200 W and 5 mTorr pressure of Ar gas sputtered for 200 seconds, and the Pt layer deposited at 200 W at 2.5 mTorr Ar gas sputtered for 600 seconds. Both layers were deposited at room temperature. The piezoelectric film deposition was done by spin coating a 0.75M 2-MOE (2-methoxyethanol) based PZT solution at 3000 rpm. Each layer gave approximately 0.12-0.2 μm in thickness depending on the spin speed and exact solution molarity. Three to four layers were deposited to achieve a thickness of 0.5-0.6 μm. The film was heat treated after each deposited layer with a three step heat treatment process: two pyrolysis steps at one minute each, one at 250° C., and one at 350-400° C.; and one crystallization step for one minute in the RTA at 670° C. in air.

The film was them sputtered with a 500 Å thick Pt top electrode at 2.5 mTorr pressure. Dielectric properties and x-rays were collected on the films to determine that the properties were satisfactory. During the second step of the process the film was masked in the shape of the transducer, and etched down to the bottom platinum.

Figure 14A:
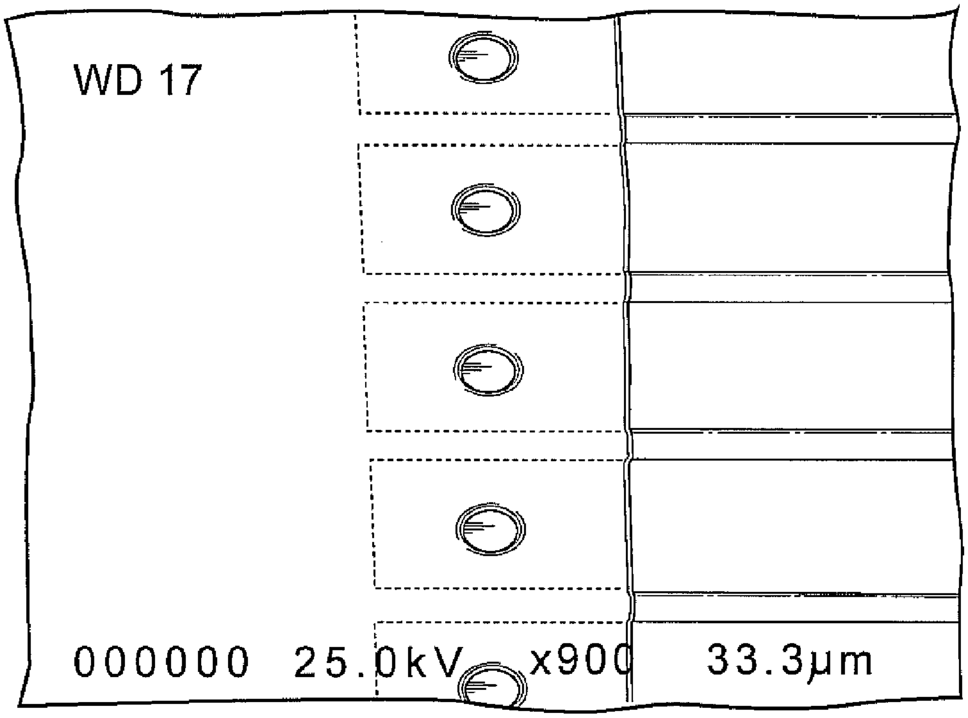
FIGS. 14A-14C are electron micrographs illustrating xylophone transducer fabrication.

The wafer was then coated with $SiN_x$. Vias were patterned on the tips of the transducers to allow for top electrode contact, and the $SiN_x$ was removed from the rest of the transducer. An SEM image of the vias is shown in FIG. 14A. A large bottom electrode pad is also left uncovered to serve as the contact to the bottom electrode.

The $SiN_x$ is deposited in order to isolate the bottom and top electrode traces with a lower permittivity dielectric than PZT. In order to deposit the top electrode traces to contact the transducer fingers, the wafer was then sputtered with Cr/Au, patterned, and etched.

Then the transducers were partially released from the substrate to make them into a T-bar shaped structure. This was done by partially removing the $SiO_2$ and Si via RIE and $XeF_2$.

Figure 14B:
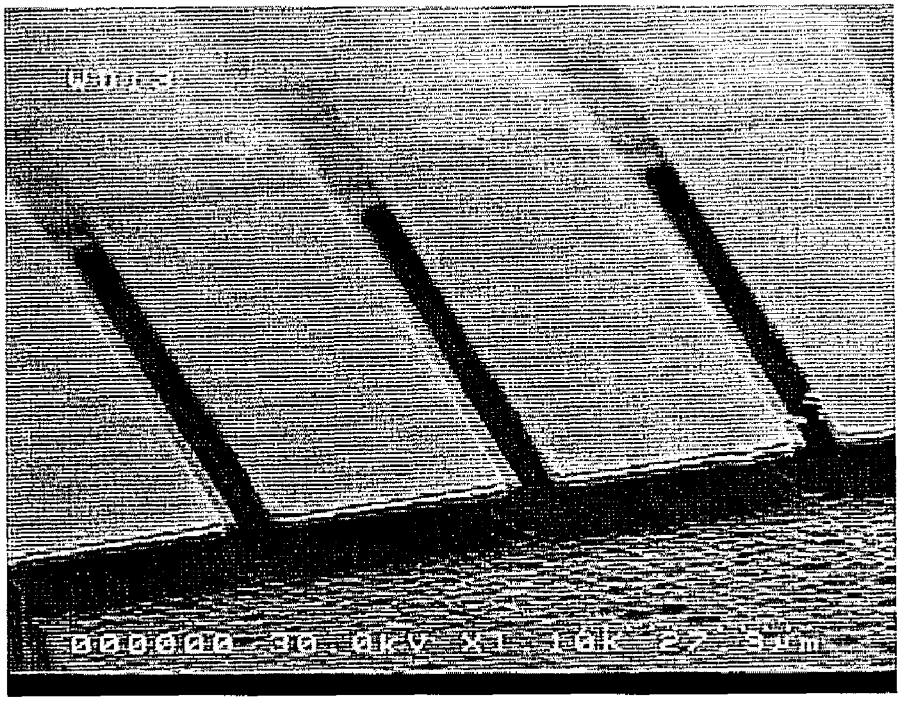
Figure 14C:
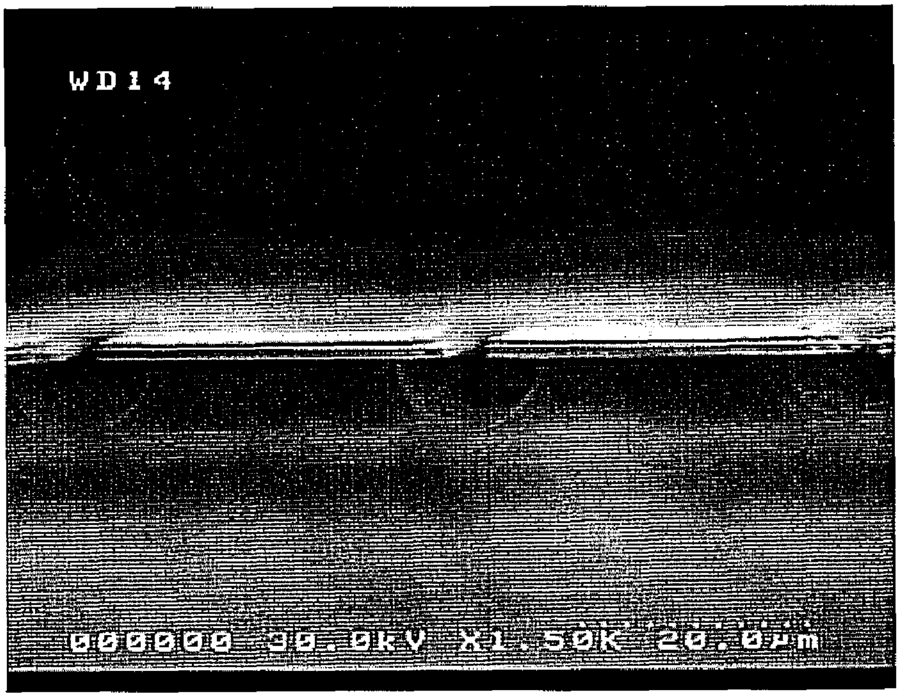

FIGS. 14B and 14C show a released xylophone transducer after etching, using scanning electron microscopy. FIG. 14B is a plan view and FIG. 14C is a side view.

Other examples of the present invention include an array of transducers having a thin film of piezoelectric material located in a sandwich structure between top and bottom electrodes, the sandwich structure not being partially released from the substrate. In such cases, a resonance frequency may not be observed, but high frequency ultrasound may be obtained using electrical signals at the desired frequency. A one-dimensional array may comprise elongated structures, elongated in the plane of the substrate.

Piezoelectric Materials and Thin Film Deposition

Improved high resolution ultrasound systems may include higher sensitivity, higher bandwidth materials such as lead zirconate titanate (PZT) in place of weak piezoelectrics such as ZnO. The piezoelectric properties are maximized at a composition of $PbZr_{0.52}Ti_{0.48}O_3$ (PZT 52/48), so this composition is useful. Other alternatives include doped PZT piezoelectrics, solid solutions of $PbTiO_3$ with relaxor ferroelectrics, and other high piezoelectric coefficient materials. Crack-free dense films of PZT 52/48 were prepared up to 5 microns in thickness on silicon substrates by a chemical solution deposition process, and thicknesses up to 10 microns and greater are possible. Typically, at room temperature, the films show dielectric constants near 1100, with loss tangents below 2% at 10 kHz. The PZT 52/48 film showed thickness coupling coefficients, $k_t$ of 0.5 or higher at 800 MHz. This is at least two times higher than in thin films such as AlN or ZnO. Furthermore, the measured attenuation was ~2000 dB/cm, smaller than many bulk PZT ceramics at 80 MHz. Thus, PZT films are excellent for high frequency ultrasound transducer applications.

Thin films may be deposited using spin-coating, mist deposition, vapor deposition, physical deposition, or other deposition technique.

Electronic Integration

A full custom designed RF subsystem chip was developed for the analog signal to and from the transducers. A proof of concept demonstration was targeted to a 50 MHz transducer using 0.35 micron CMOS technology.

Figure 15:
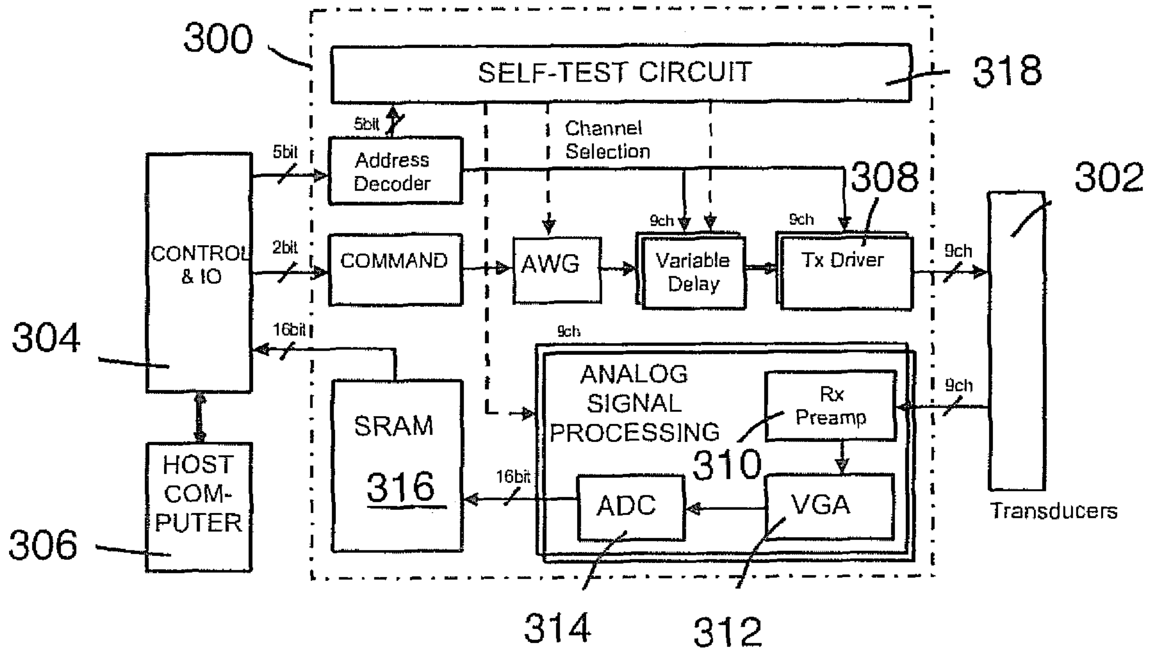
FIG. 15 is a schematic of a CMOS-based electronic circuit for transducer control.

FIG. 15 shows a simplified schematic of a CMOS chip that can be used with the ultrasound transducers. The chip schematic is shown within dashed line 300, and comprises a transmitter driver 308 sending channels to the transducer array. The CMOS chip also includes a receiver preamplifier 310, a variable gain amplifier 312, and an analog-to-digital converter 314 that provides digital signals to an SRAM shown at 316. The CMOS chip can be used with an external control circuit 304, for example control by a host computer 306.

There are provisions on the top surface of the chip for connecting and mounting of the ultrasound transducers, as well as test access so that the function of the electronics can be ascertained independently. Close proximity placement of the transducers to the signal sensor circuits significantly enhances the signal to noise ratio needed for better image quality. Also integrating the RF subsystem on a single chip allows a very high-speed signal acquisition in a very compact space.

The functions of an example electronic circuit (for example, an RF chip) may include one or more of the following:

AWG and Variable Delay: An Arbitrary Waveform Generator (AWG) has the capability to generate multiple gated bursts of single cycle sinusoidal or monocycle excitation. The variable delay network allows different delay time for each of the transducers (or blocks of transducers) in an array, which allows the transmitter to have ultrasound beam steering and focusing capabilities.

Transmit/Receive Switch Matrix: Each transducer may be driven by its own driver. Drivers are design to provide voltage and current necessary to fully actuate the transducers. The driver output may be disconnected (tri-state) during the receive operation.

Preamp: A fixed gain (19 dB) amplifier can be used for the receive signal. The bandwidth of a preamp may be at least 52 MHz.

VGA: A Variable Gain Amplifier provides any necessary gain boost for the reflected ultrasound signal, for example weaker signals from deeper depth. A time varying control signal can be applied to the VGA gain control input.

ADC: Analog to Digital Converter. A chip was designed having 9 Analog to Digital Converters on chip, each one dedicated to an individual RF receive channel. Each ADC is capable of 8 bit precision at 250 MS/s speed with 0.85~2.45 dynamic range.

SRAM: Analog to Digital Converter output data is saved on the on-chip high speed SRAM. Then the data is transferred to the host DSP processor at slower speed. This configuration allows the highest speed operation for the receiver. A 3K byte SRAM was included for each receive channel, and the SRAM supports over 250 Mbyte/s writing speed.

On-chip Self-test Circuitry: This circuitry, if present, increases the chip functionality by offering several design and test options for the RF chip. The specification of the RF chip can be changed by this circuitry even after fabrication.

Transmit Oscillator: Generates, for example, a 50 MHz signal to be sent to the transducers.

System Clock Oscillator: Generates a 150 MHz clock signal for the digital and ADC circuits on the chip.

Figure 16:
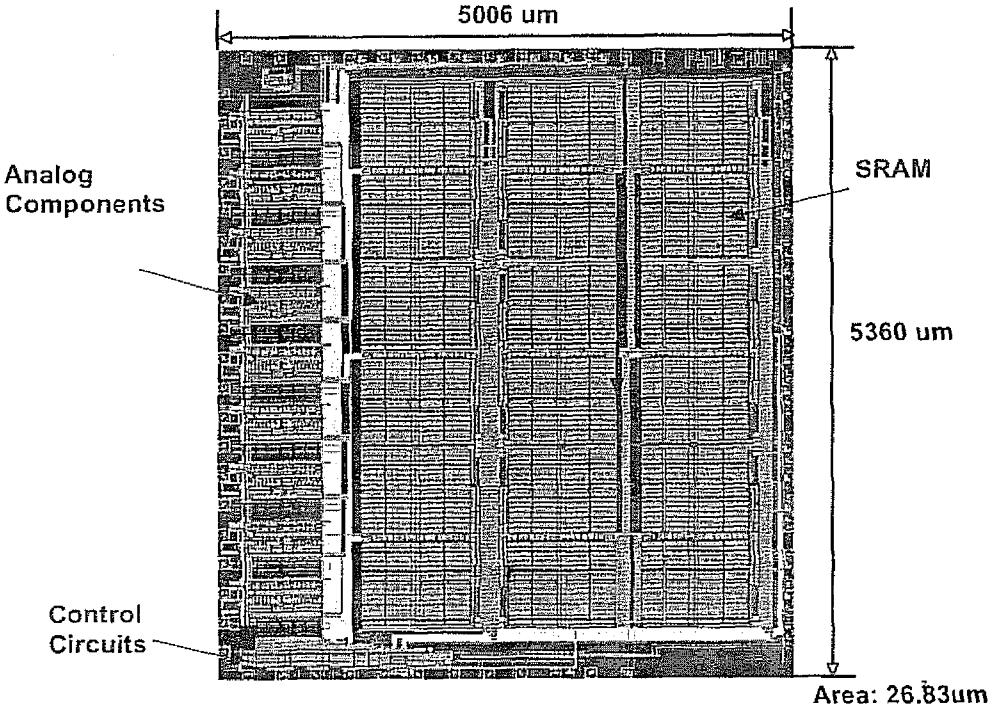
FIG. 16 shows a possible layout of an RF chip for electronic driving of the transducer array.

FIG. 16 shows a possible arrangement of the CMOS components on a prototype chip, designed using 0.35 micron CMOS technology.

An electronic circuit, for example a digital IC used for control electronics, may be proximate to the transducer array, for example supported on the same circuit board, located within the same housing, or similarly close coupled.

Integrating the transducer arrays with a front end electronic circuit offers several advantages over conventional state of the art systems. First, conventional systems interface multiple transducer elements to the RF front end using coax cabling networks. These networks contain many cables that are specifically impedance matched to the RF front end components such as the transmit/receive switch. Having the transducer array interfaced to the RF front end directly eliminates the need for impedance matched cables.

Lateral resolution LR, $$LR = f^{\#}\lambda = \frac{f}{a}\lambda$$

where f/a=focal length/aperture, is proportional to wavelength λ and inversely proportional to aperture, so that the higher the frequency, the higher the lateral resolution required. Also, the higher the frequency the smaller the device size, so that in-vivo cellular imaging is possible at higher frequencies.

Scanning Acoustic Microscopy (SAM)

Figure 17:
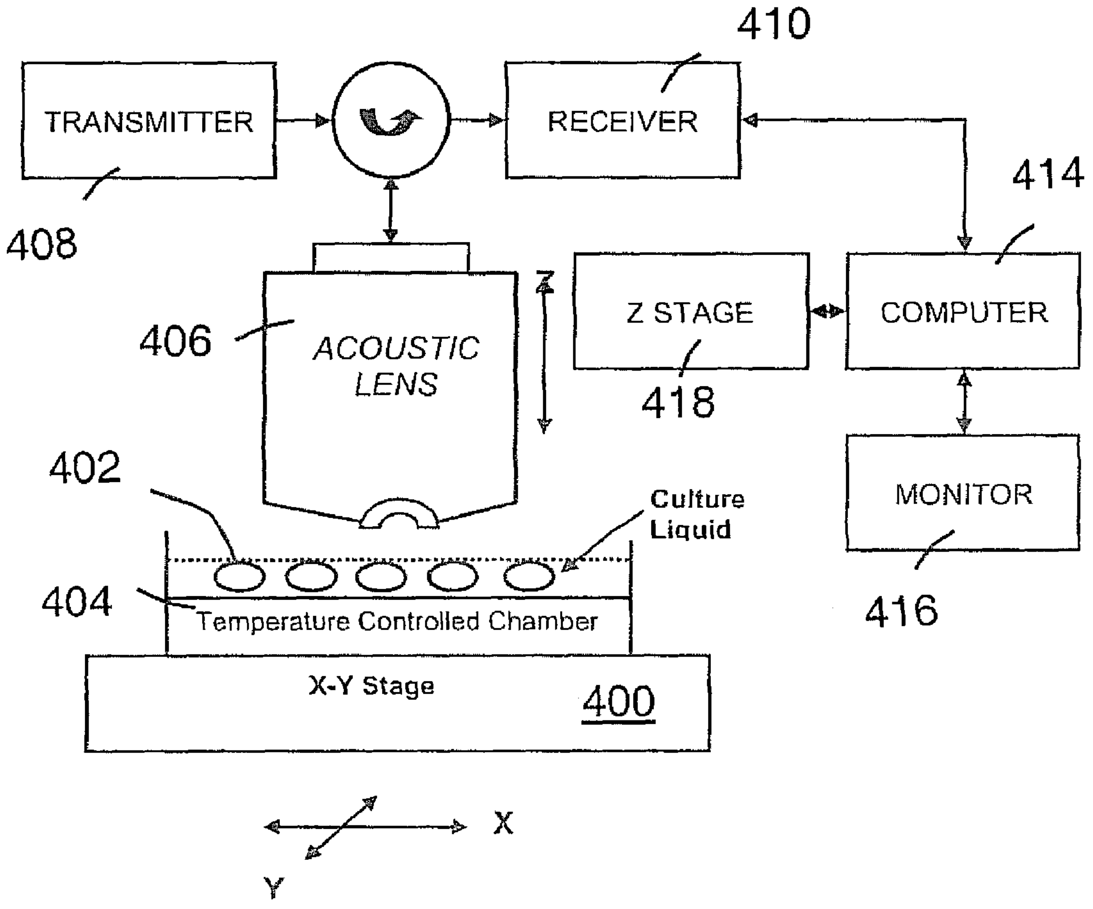
FIG. 17 is a simplified schematic of a scanning acoustic microscope (SAM).

FIG. 17 shows a schematic diagram of a scanning acoustic microscope (SAM). This shows an XY stage 400, temperature control chamber 404, cells within a culture liquid 402

(though other samples may be studied), acoustic lens 406, transmitter 408, receiver 410, Z stage adjustment 412 (focusing), computer 414, and monitor 416. Acoustic microscopy using ultrasound transducer arrays according to the present invention provides higher resolution than previously obtainable.

In a conventional SAM, the transducer is a single element. An electrical signal (for example, a tone-burst wave) generated by a transmitter is used to excite a piezoelectric transducer. For high frequency microscopes (e.g. more than 50 MHz), the input voltage from the transmitter to the transducer is conventionally in the range of 60-100 V. The electrical signal is converted into an acoustic signal by the transducer. The ultrasonic plane wave travels through a buffer rod made of sapphire to a lens located at the bottom of the buffer rod. The lens converts the ultrasonic plane wave to an ultrasonic spherical wave, which enables focusing at a fixed depth. Existing systems at frequencies above 50 MHz are single element transducers only.

When a single element transducer is used to form an image, the transducer needs to be scanned across the sample, for example using a precision x-y motion-controlled positioning stage, and an ultrasound lens is used for sub-surface visualization (i.e. transducer focus). The use of imaging arrays allows imaging without stage control, or in the case of a 1-D array, only one dimension needs to be scanned. A lens may not be necessary if the array has focusing capabilities.

Typically, the voltage of the receiver electrical signal ranges from 50 mV to 500 mV. When the operating frequencies of conventional single element transducers range from 50 MHz to 1 GHz, the corresponding values for the insertion loss range from approximately 30 dB to 80 dB. Therefore, the electric signals are amplified by 30 dB to 80 dB at a receiver. The weak return waves are amplified by a pre-amplifier and a variable gain amplifier, so that information from different depths in the sample can be obtained. Then, the peak of the amplitude of the electric signal is detected and stored into memory through an analog-to-digital converter. This flow of processes allows the information that is collected at a single spot on the sample to be displayed as intensity or to be manipulated in other ways. Each transducer element requires extensive electronics for the pulse timing, as well as for the receiver electronics with respect to time varying gain control. In addition, the size of the x-y positioning system makes in vivo applications impractical. For a conventional SAM, the cabling, especially for transducer arrays, is typically quite massive.

The conventional need for very different voltage levels on the transmit and receive portions of the signal eliminates the possibility of integrating the electronics onto a chip level. Conventional ultrasound transducer arrays require high voltages (typically ±100 V) required to excite the transducer, and use heavy cables that connect the transducer to the ultrasound engine, leading to a large sized system. The high voltage requirement for conventional ultrasound transducer excitation may conventionally require separation of the RF analog front-end electronic circuit and the transducer, resulting in use of expensive and heavy analog co-axial cables. Such relatively long cables, typically containing 32 to 1024 micro-coaxial wires, is one of the most expensive parts of a conventional ultrasound imaging system. Ultrasound technicians using current equipment sometimes suffer wrist fatigue associated with the heavy cables. Thick cables are also a detriment for high functionality catheter-based applications of ultrasound imaging. Most ultrasound instruments are either cart or table-sized instruments.

However, system miniaturization has been hindered by the high drive voltages which prevented using the same electronics platform for both drive and receive electronics. Each piezoelectric element of an array may use extensive electronics for the timing of the transmit pulses, as well as for the receive electronics. Because commercially available transducers perform the signal processing off-chip, the cables for transducer arrays are typically massive, and are a major source of fatigue for ultrasound operators. The low voltage operation of transducers according to the present invention allows circuit integration, and may eliminate the need for coaxial cables.

Other Applications

Transducer arrays according to embodiments of the present invention are useful in various applications, such as detection of plaque buildup in the arteries around the heart, non-destructive cell imaging, real-time tissue biopsy, and other applications that require cellular and sub-cellular imaging resolution.

For example, currently combinatorial methods for drug screening are often limited by the ability to detect the effect of a particular drug combination on a cell. Typically, the cells need to be killed (e.g. by staining them to enable optical characterization) in order to ascertain drug-induced changes. Introduction of an ultrasonic technique with sufficient lateral and depth resolution eliminates the need to kill the cells, and can be used to study the impact of drugs on healthy or cancerous cells as a function of time. Current high frequency ultrasound arrays lack the required resolution; embodiments of the invention described here provide sufficient resolution for in vivo cell imaging.

Devices according to the present invention are useful for pill ultrasound cameras, probe-mounted sensors, wireless ultrasound arrays, weapons, and other applications, including compact, lightweight, applications such as battery-powered hand-held devices. Applications include diagnostic systems that allow drug reactions with individual live cells to be monitored (allowing physicians to develop drug treatments adapted to each patient without chemical markers), high resolution catheter-based ultrasonic probes for real-time tissue biopsies, other in-vivo imaging applications, and wireless replacements for current ultrasound transducers, such as a wireless ultrasound unit with the ability to focus in both azimuth and elevation.

Using an integrated electronic circuit, operator wrist fatigue associated with the heavy cabling of conventional medical ultrasound imagers is eliminated.

Other applications include medical monitoring (such as detection of plaque buildup in the arteries around the heart), non-destructive cell imaging, real-time tissue biopsy, and other sub-cellular imaging applications. The effects of drugs or other agents on healthy or cancerous cells or small experimental animals may be monitored as a function of time and depth.

Apparatus and methods according to the present invention may be adapted for other applications, such as MEMS device fabrication, piezoelectric actuators, and piezoelectric pump fabrication.

Piezoelectric materials used in example transducers may include bulk polycrystalline ceramics, single crystal ceramics (such as lithium niobate or potassium niobate), relaxor materials (such as PMN-PT, lead magnesium niobate-lead titanate), ferroelectric polymers and copolymers (such as PVDF, polyvinyldine fluoride), other ferroelectric polymers (including copolymers), ceramic/polymer composites, other piezoelectric films (such as zinc oxide, aluminum nitride), and the like. All-polymer or polymer substrate flexible devices are possible.

Hence, an example ultrasound device comprises a miniature transducer array and (optionally) integrated electronics. There is currently no alternative technology which enables a transducer array at the frequency range of interest (50 MHz-1 GHz), with low voltage operation so the transducers can be driven, for example, with CMOS voltages. A novel micron-scale 2D piezoelectric transducer array was designed.

Existing piezoelectric transducers resonate at frequencies up to 1 GHz but are very much larger in size, requiring much higher excitation voltages, and are only single elements, making it impossible to electrically steer and focus the beam. Conventionally, the electrical circuitry is always physically separated from the transducer and requires expensive analog impedance matched cables to connect to the individual transducer elements.

Novel processing methods described herein enable transducer arrays to be fabricated with high operating frequencies (>20 MHz, in particular in the range of approximately 50 MHz to approximately 1 GHz). The operating voltage for the transducer can be much lower than for conventional transducers, enabling electronic integration of the transmit and receive channels. The drive/receive electronics for the array transducer can be miniaturized and integrated with the transducer on a CMOS platform.

Ultrasonic transducers according to the present invention enable high resolution ultrasonic imaging, e.g. for cell imaging, biomedical ultrasound applications, and non-destructive testing, among other possible applications.

High aspect ratio and thin ferroelectric structures may be prepared by conformal coating of patterned templates to provide an array of transducers. This approach enables preparation of piezoelectric structures which range from a few microns to hundreds of microns tall (for example, with a height between approximately 0.1 micron and approximately 500 microns), and only a fraction of a micron to a few microns in lateral dimension. Reduced lateral spacing facilitates higher frequency operation. For human tissue imaging, a pitch of between 30 and 10 microns may be readily fabricated using techniques described herein for an operating frequency between 50 megahertz to 150 megahertz respectively.

The piezoelectric thin films can be thin (for example, a film thickness in the range 50 nm to 5 microns) allowing low voltage operation and direct coupling with integrated circuit based control electronics. With independent control of each piezoelectric element, it is possible to focus the beam in 2 or 3 dimensions. There is currently no alternative technology that enables this capability over a frequency range of 20 MHz to 1 GHz.

Arrays of piezoelectric elements may also be created by a mold replication process using micromachined templates, such as a silicon template. Small wall thicknesses (piezoelectric thin film thicknesses within a tube wall) allow low voltage operation. A two dimensional array of elements on the scale of the acoustic wavelength enables beam steering and focusing for higher resolution ultrasound images. The transducer arrays can also be used for time-lapse imaging in four dimensions (3 spatial dimensions and time). Beam focusing can be used to select a portion of a sample for imaging.

For all examples, lower resistance electrodes with higher current carrying capabilities may be fabricated by masking all areas of the device except the metal contact layers, and plating additional metal onto the contact layers.

Ultrasound arrays according to the present invention include linear, curved, phased, and annular arrays. Arrays may allow electronic beam steering, and electronic focusing and beam forming, providing valuable control of the focal distance and beam width through an image volume. Templates used and/or device substrates may be generally planar, curved, or otherwise shaped. Protrusions, used as an inner electrode for an ultrasound transducer, may include pillars, ridges (such as wall structures elongated in the plane of the substrate, rings, curved elements, and the like), and piezoelectric layers may coat some or all of the surface of such protrusions, for example the sides only (surfaces generally orthogonal to the substrate), sides and top, selected sides of a polygonal cross section post, and the like.

Examples of the present invention also include devices having a single ultrasound transducer. In such cases, the diameter of an inner electrode (e.g. for post-like structures) or area of a generally planar multilayer structure may be relatively large compared to array devices.

Hence, an example ultrasonic transducer comprises a piezoelectric element, the piezoelectric element producing an ultrasonic signal on application of a drive voltage, the piezoelectric element comprising a thin film of piezoelectric material, the drive voltage being applied across the thin film. The thin film of piezoelectric material may have a film thickness between approximately 50 nanometers and approximately 5 microns, and the drive voltage may be 10 volts or less, peak-to-peak. The piezoelectric material may comprise lead zirconium titanate (PZT). The piezoelectric material may be in the form of a tube of piezoelectric material, the tube having an inner surface and an outer surface, the drive voltage being applied between electrodes on the inner surface and the outer surface. The tube of piezoelectric material may be supported on a metal post, with or without additional inner electrode layer(s), and with or without a cap layer on the tube (for example, an optional piezoelectric covering of the top of the pillar.

An ultrasonic device may comprise an array of ultrasonic transducers, drive electronics for applying drive voltages to the array of ultrasonic transducers, the ultrasonic transducers producing an ultrasonic signal in response to the drive voltages, and receiver electronics producing sensor signals in response to ultrasound incident on the array of ultrasonic transducers, wherein the array of ultrasonic transducers and drive electronics are integrated, for example so that no external cabling is required. The drive electronics and receiver electronics may both be provided by a digital integrated circuit, such as CMOS or TTL the digital integrated circuit and the array of ultrasonic transducers being supported on the same circuit board.

Example devices according to embodiments of the present invention include one and two dimensional arrays. A one dimensional transducer arrays may include a comb-like structure, for example a plurality of elongated multilayered structures supported by a substrate, each including a dielectric layer (e.g. silicon nitride or silica), a bottom electrode (e.g. sputtered Ti/Pt), a piezoelectric thin film (e.g. PZT), and a top electrode. The piezoelectric thin film may be deposited by spin-coating, in the case of PZT using a 2-methoxyethanol based solution. The multilayered structures may be partially released from the underlying substrate by etching an underlying layer to form a T-bar shaped transducers. Two-dimensional arrays may include generally tube-like structures and/or post-like structures extending from the substrate, for example piezoelectric thin films supported by inner electrodes in the form of tubes or posts. Tube structures were fabricated using vacuum assisted infiltration, for example using infiltration of PZT and electrode solutions into a silicon mold.

U.S. Provisional Patent Application Ser. No. 60/798,640 filed May 8, 2006, is incorporated herein by reference.

The invention is not restricted to the illustrative examples described above. Examples are not intended as limitations on the scope of the invention. Methods, apparatus, compositions, and the like described herein are exemplary and not intended as limitations on the scope of the invention. Changes therein and other uses will occur to those skilled in the art. The scope of the invention is defined by the scope of the claims.

Having described our invention, we claim:

1. An apparatus including a plurality of ultrasound transducers, each ultrasound transducer comprising:

a first electrode;

a second electrode, the first electrode and the second electrode having an electrode separation;

a thin film located between the first electrode and the second electrode, the thin film comprising a piezoelectric material having a film thickness; and a substrate supporting the plurality of ultrasound transducers, the electrode separation being less than 10 microns, each transducer comprising a multilayer structure including the first electrode, the thin film, and the second electrode, the first electrode, thin film, and second electrode being generally parallel, the multilayer structure being generally planar and disposed parallel to the substrate, each ultrasonic transducer having an elongated form having a length and a width, the length being at least double the width, the multilayer structure being partially released from the substrate and supported on the substrate so as to form a T-bar shaped transducer.

2. The apparatus of claim 1, wherein the multilayer structure is a generally planar multilayer structure having a first area, the multilayer structure being attached to the substrate through a support, the support having a cross-sectional area at least 10% less than the first area.

3. The apparatus of claim 1, further comprising an electronic circuit integrated with the plurality of ultrasound transducers, the electronic circuit being operable to apply a drive signal to selected ultrasound transducers, the drive signal having a signal frequency of at least 20 MHz, the drive signal having a signal voltage of less than 10 volts peak to peak, the drive signal being applied to the selected ultrasound transducers so as to generate ultrasound radiation, the apparatus being an ultrasound generator.

4. The apparatus of claim 3, wherein the signal voltage is 5volts peak to peak or less.

5. The apparatus of claim 3, wherein the drive frequency is between approximately 50 MHz and approximately 1 GHz.

6. An apparatus including:

a plurality of ultrasound transducers, each ultrasound transducer comprising:

a first electrode;

a second electrode, the first electrode and the second electrode having an electrode separation;

a thin film located between the first electrode and the second electrode, the thin film comprising a piezoelectric material;

a substrate supporting the plurality of ultrasound transducers; and an electronic circuit integrated with the plurality of ultrasound transducers, the electronic circuit being operable to apply a drive signal to selected ultrasound transducers, the drive signal having a signal voltage of less than 10 volts peak to peak, the first electrode, thin film, and second electrode being generally parallel and forming a generally planar multilayer structure, each generally planar multilayer structure being generally rectangular in the plane of the substrate, having an elongated form having a length and a width, the length being at least double the width, each generally planar multilayer structure being partially separated from the substrate, being attached to the substrate through a transducer support having a cross-sectional area at least 10% less than that of the generally planar multilayer structure, the film thickness being between approximately 50 nm and approximately 5 microns, the drive signal being applied to the selected ultrasound transducers so as to generate a beam of ultrasound radiation.

7. The apparatus of claim 6, wherein the generally planar multilayer structure is generally parallel to the substrate.

8. The apparatus of claim 6, having a one-dimensional linear array of ultrasound transducers arranged along an array direction, the generally planar multilayer structure being elongated along a direction orthogonal to the array direction.

9. The apparatus of claim 6, each generally planar multilayer structure being partially separated from the substrate at both ends thereof so as to form a T-shaped transducer.

10. The apparatus of claim 1, wherein the generally planar multilayer structure is generally parallel to the substrate.

11. The apparatus of claim 1, wherein the generally planar multilayer structure has an area and is supported on the substrate by a support, the support having a cross-sectional area less than the area.

12. The apparatus of claim 1, having a one-dimensional linear array of ultrasound transducers arranged along an array direction, the generally planar multilayer structure being elongated along a direction orthogonal to the array direction.

* * * * *

UNITED STATES PATENT AND TRADEMARK OFFICE

CERTIFICATE OF CORRECTION

| | | |
|---|---|---|
| PATENT NO. | : 8,183,745 B2 | Page 1 of 1 |
| APPLICATION NO. | : 11/745615 | |
| DATED | : May 22, 2012 | |
| INVENTOR(S) | : Susan Trolier-McKinstry et al. | |

It is certified that error appears in the above-identified patent and that said Letters Patent is hereby corrected as shown below:

Col. 6, line 52: replace “Fig. 21” with --Fig. 2B--;
Col. 8, line 12: replace “firms crystallized” with --films crystallized--;
Col. 8, line 46: replace “SUS” with --SU8--;
Col. 11, line 5: replace “bad a thickness” with --had a thickness--;
Col. 12, line 48: replace “was them sputtered” with --was then sputtered--.

Signed and Sealed this
Fifth Day of February, 2013

Teresa Stanek Rea
*Acting Director of the United States Patent and Trademark Office*